US011532732B2

(12) United States Patent
Jhan et al.

(10) Patent No.: US 11,532,732 B2
(45) Date of Patent: Dec. 20, 2022

(54) MULTI-GATE DEVICE AND METHOD OF FABRICATION THEREOF

(71) Applicant: Taiwan Semiconductor Manufacturing Company, Ltd., Hsin-Chu (TW)

(72) Inventors: Yi-Ruei Jhan, Keelung (TW); Kuan-Ting Pan, Taipei (TW); Kuo-Cheng Chiang, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 75 days.

(21) Appl. No.: 17/238,569

(22) Filed: Apr. 23, 2021

(65) Prior Publication Data
US 2021/0257480 A1 Aug. 19, 2021

(51) Int. Cl.
*H01L 29/66* (2006.01)
*H01L 29/78* (2006.01)
(Continued)

(52) U.S. Cl.
CPC .... *H01L 29/66795* (2013.01); *H01L 21/0259* (2013.01); *H01L 21/02532* (2013.01); *H01L 21/31155* (2013.01); *H01L 29/0665* (2013.01); *H01L 29/42392* (2013.01); *H01L 29/6656* (2013.01); *H01L 29/66545* (2013.01);
(Continued)

(58) Field of Classification Search
CPC .......... H01L 21/02532; H01L 21/0259; H01L 21/02603; H01L 21/31155; H01L 21/823821; H01L 21/823431; H01L 21/823481; H01L 21/823878; H01L 29/0665; H01L 29/42392; H01L 29/517; H01L 29/66545; H01L 29/66553; H01L 29/6656; H01L 29/66636; H01L 29/66666; H01L 29/66742; H01L 29/66795; H01L 29/6681; H01L 29/7843; H01L 29/785; H01L 29/78618; H01L 29/78696; B82Y 10/00; B82Y 40/00
See application file for complete search history.

(56) References Cited

U.S. PATENT DOCUMENTS 8,796,666 B1 8/2014 Huang et al.
8,815,712 B2 8/2014 Wan et al.
(Continued)

*Primary Examiner* — Cheung Lee
(74) *Attorney, Agent, or Firm* — Haynes and Boone, LLP

(57) ABSTRACT

A method includes forming a semiconductor fin extruding from a substrate; forming a sacrificial capping layer on sidewalls of the semiconductor fin; forming first and second dielectric fins sandwiching the semiconductor fin; forming a sacrificial gate stack over the semiconductor fin, the sacrificial capping layer, and the first and second dielectric fins; forming gate spacers on sidewalls of the sacrificial gate stack; removing the sacrificial gate stack to form a gate trench, wherein the gate trench exposes the semiconductor fin, the sacrificial capping layer, and the first and second dielectric fins; removing the sacrificial capping layer from the gate trench, thereby exposing the sidewalls of the semiconductor fin; and forming a metal gate stack in the gate trench engaging the semiconductor fin.

20 Claims, 28 Drawing Sheets

(51) Int. Cl.
  *H01L 21/3115* (2006.01)
  *H01L 21/02* (2006.01)
  *H01L 29/06* (2006.01)
  *H01L 29/423* (2006.01)
  *H01L 29/786* (2006.01)

(52) U.S. Cl.
  CPC .. *H01L 29/66553* (2013.01); *H01L 29/66636* (2013.01); *H01L 29/66742* (2013.01); *H01L 29/7843* (2013.01); *H01L 29/78618* (2013.01); *H01L 29/78696* (2013.01)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2017/0250281 A1* | 8/2017 | Tsai ................ H01L 21/823431 |

* cited by examiner

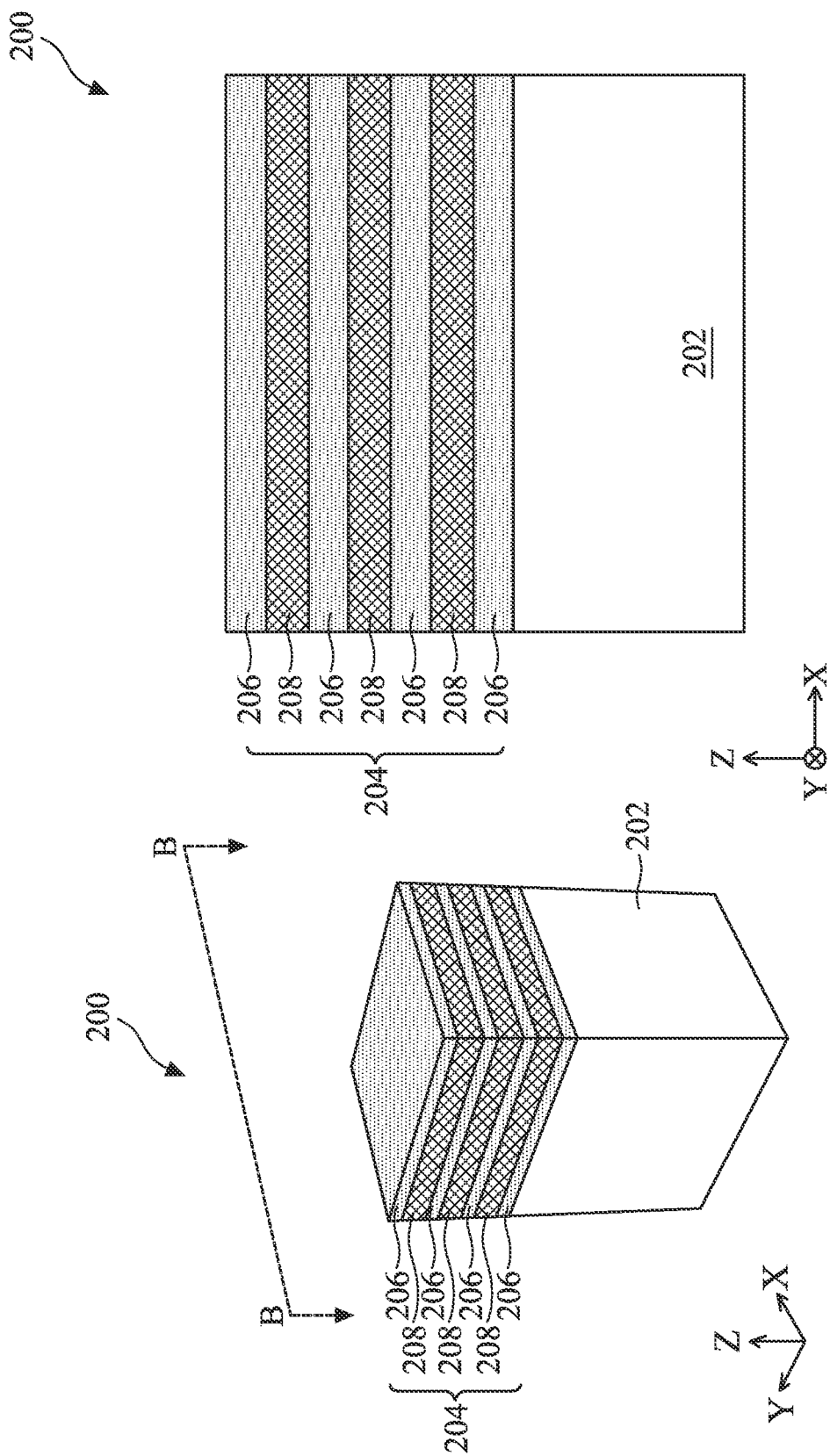

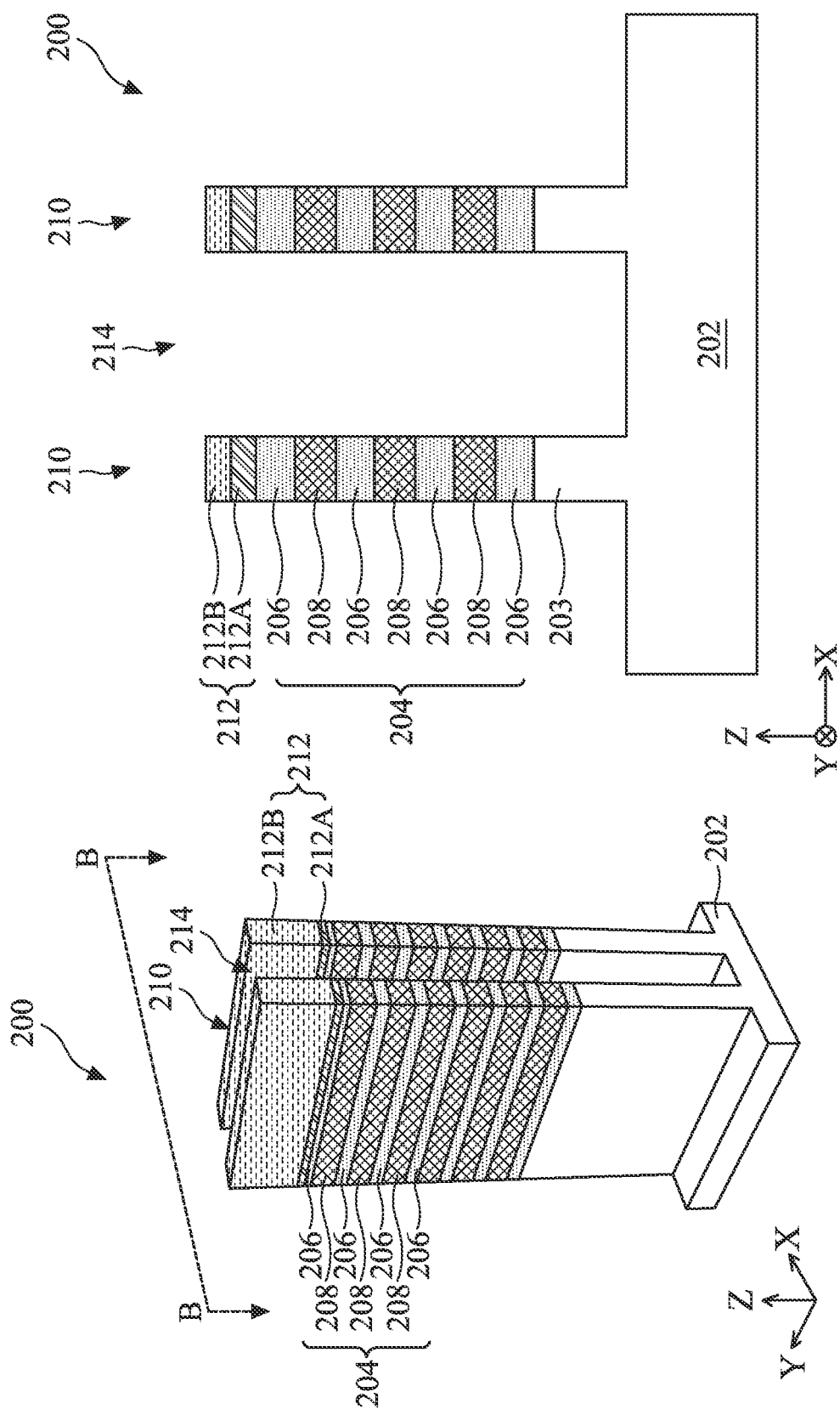

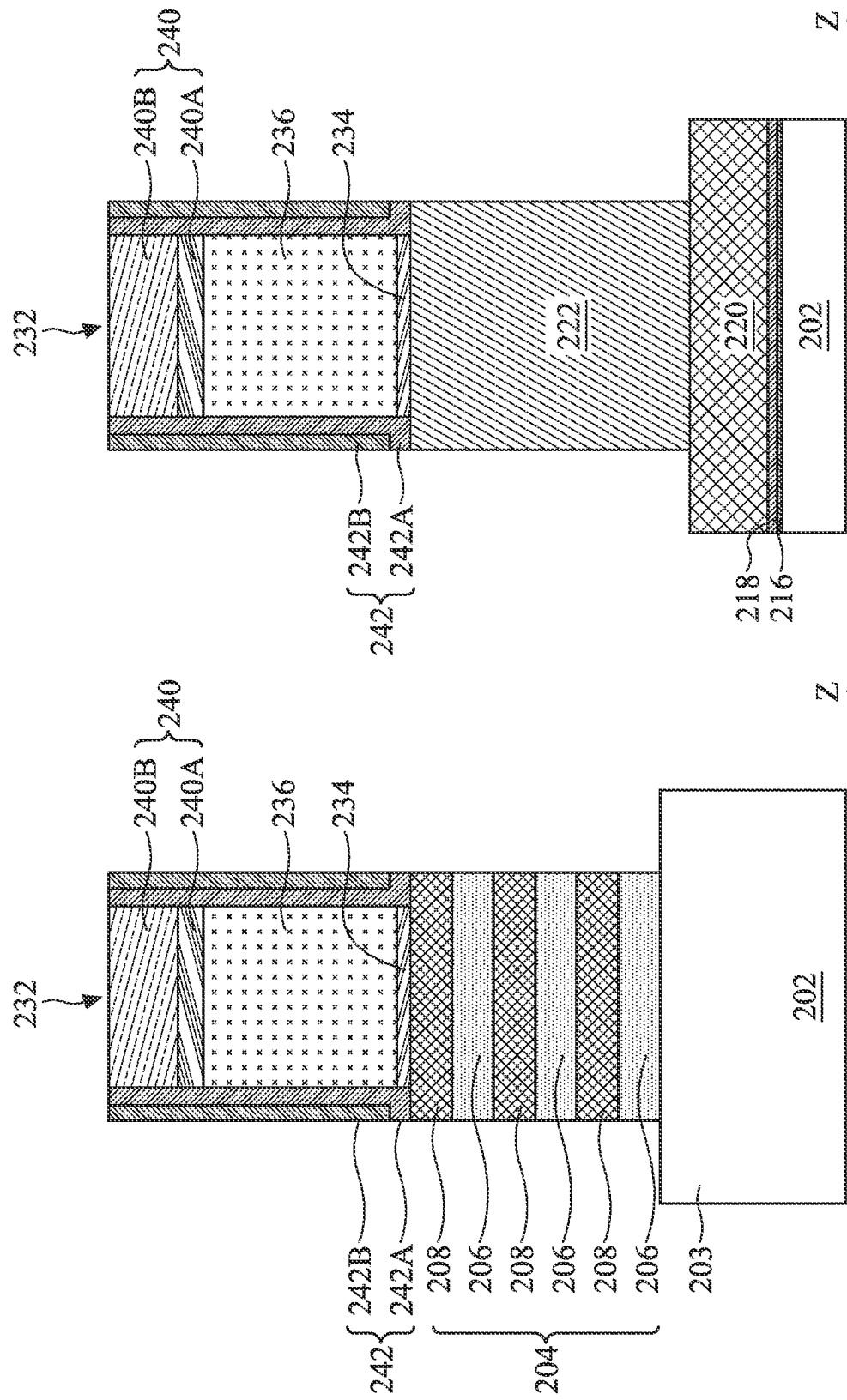

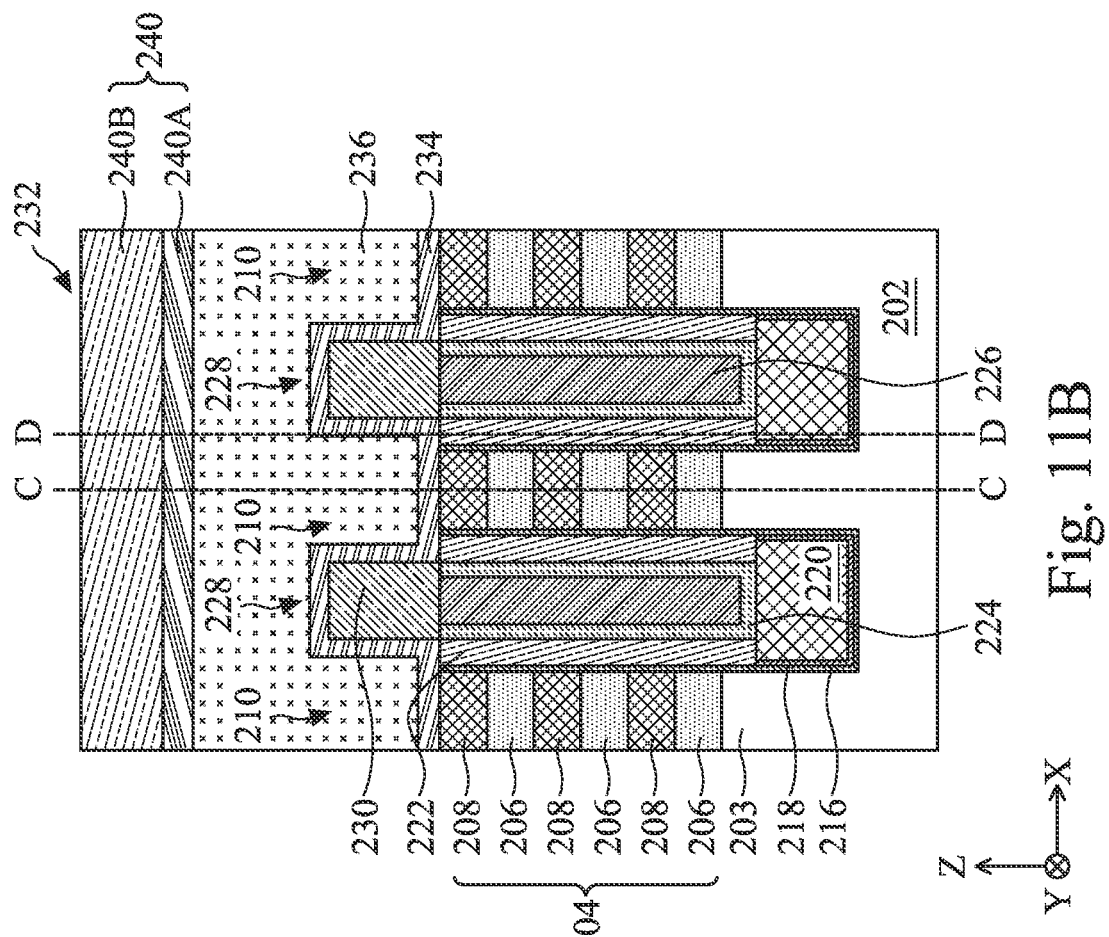
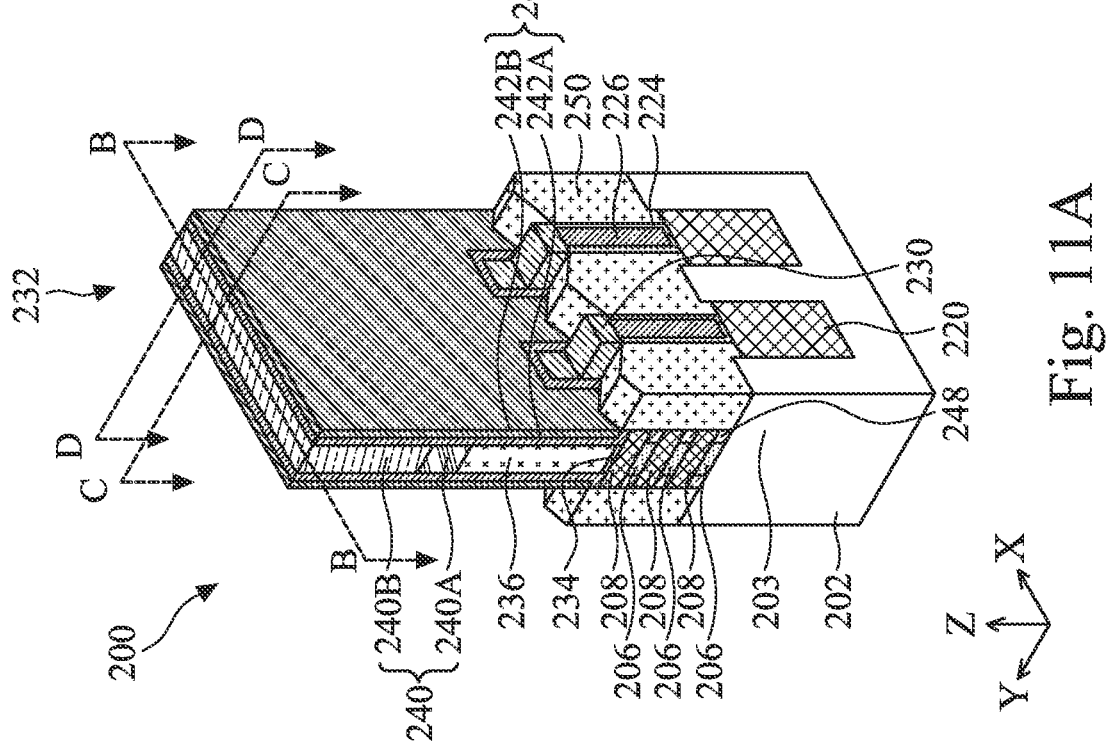
Fig. 11A
Fig. 11B

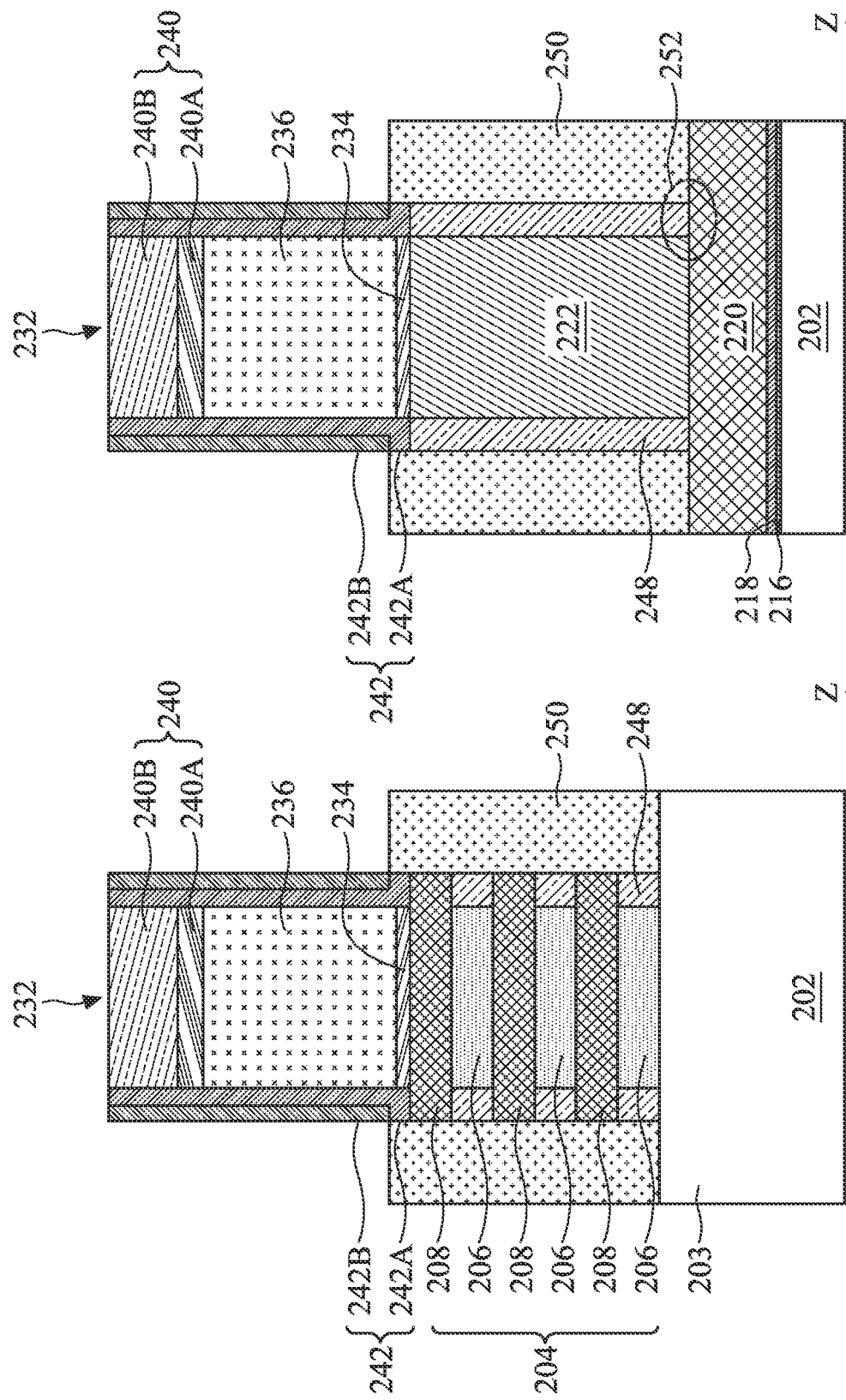

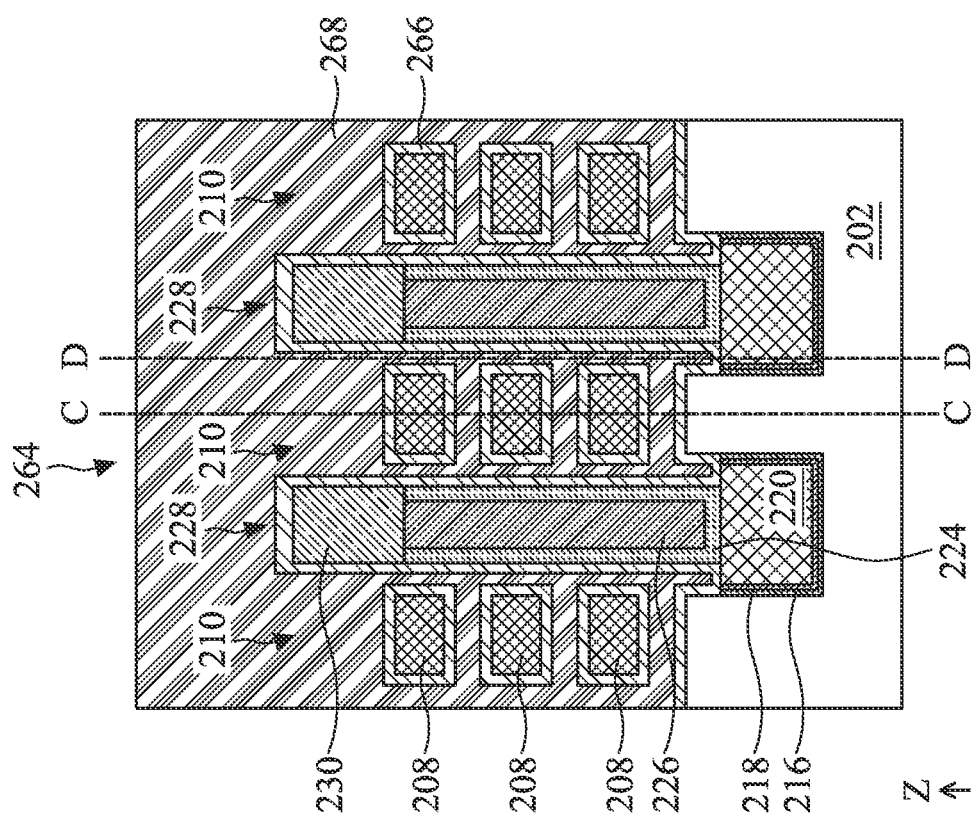
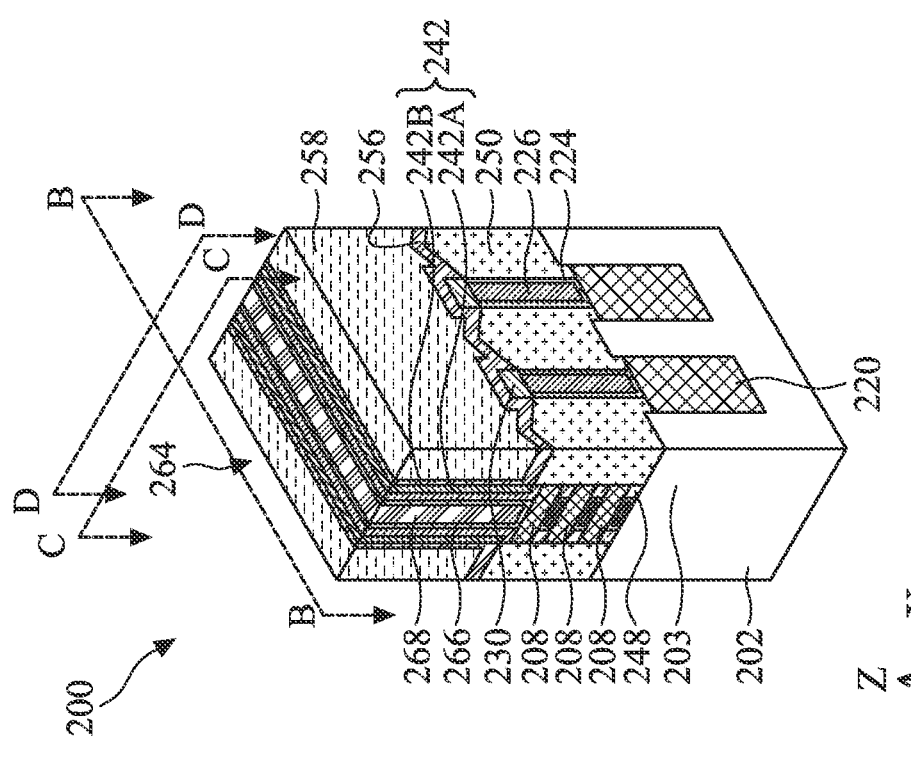
Fig. 13B
Fig. 13A

MULTI-GATE DEVICE AND METHOD OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which can extend around the channel region providing access to the channel on four sides. GAA devices are compatible with conventional complementary metal-oxide-semiconductor (CMOS) processes and their structure allows them to be aggressively scaled while maintaining gate control and mitigating SCEs.

To continue to provide the desired scaling and increased density for multi-gate devices (e.g., FinFETs and GAA devices) in advanced technology nodes, dielectric fins have been introduced to improve the uniformity of fins (including semiconductor fins and dielectric fins) and define space for source/drain (S/D) features. Sacrificial capping layers comprising crystalline semiconductor materials may also be introduced to fill between semiconductor fins and dielectric fins to reserve space for metal gate stacks in a replacement gate process. Due to natural crystal orientation, sacrificial capping layers may form a quadrilateral cavity defined by facets, such as (111) facets after an etch process, which may result in metal gate stack and inner spacer taper profiles and in turn cause S/D epi defects. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 9A, 10A, 11A, 12A, and 13A illustrate perspective views of a semiconductor structure during a fabrication process according to the method of FIGS. 1A and 1B, according to aspects of the present disclosure.

FIGS. 2B, 3B, 4, 5, 6, 7, 8, 9B, 9C, 9D, 10B, 10C, 10D, 11B, 11C, 11D, 12B, 12C, 12D, 13B, 13C, and 13D illustrate cross-sectional views of a semiconductor structure during a fabrication process according to the method of FIGS. 1A and 1B, according to aspects of the present disclosure.

DETAILED DESCRIPTION

Figure 1A:
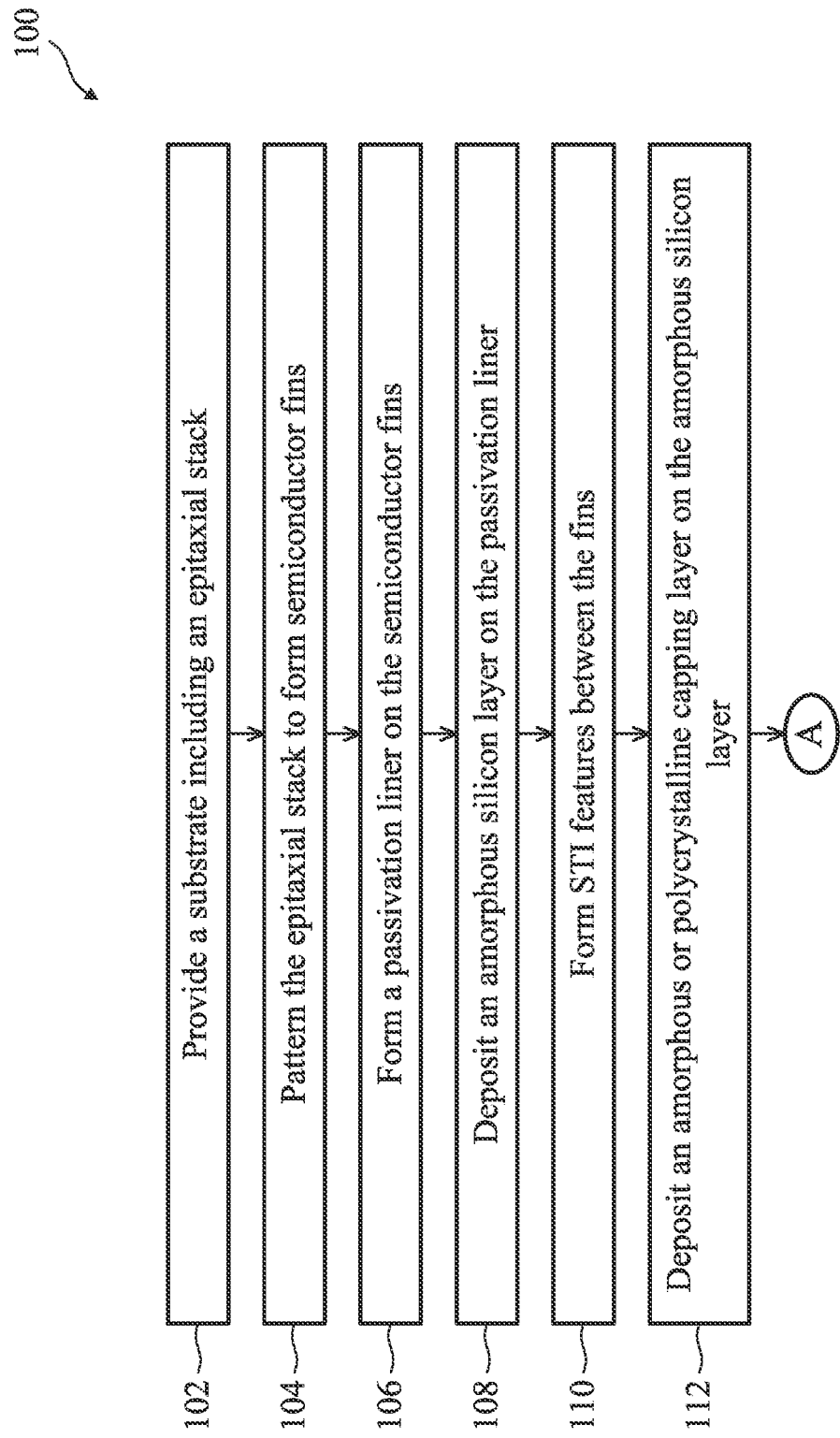
FIGS. 1A and 1B show a flow chart of a method for forming a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with dielectric fins and sacrificial capping layers in advanced technology nodes. It is noted that multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing dielectric fins for improving fin uniformity and defining space for source/drain (S/D) features, and sacrificial capping layers with amorphous or polycrystalline semiconductor material for reserving space for metal gate stacks. The amorphous or polycrystalline semiconductor material allows sacrificial capping layers to maintain vertical footing after etching process, which in turn improves inner spacer layer footing profile and metal gate stack footing profile and reduces S/D feature defects (e.g., pits in S/D features) in footing regions.

Figure 1B:
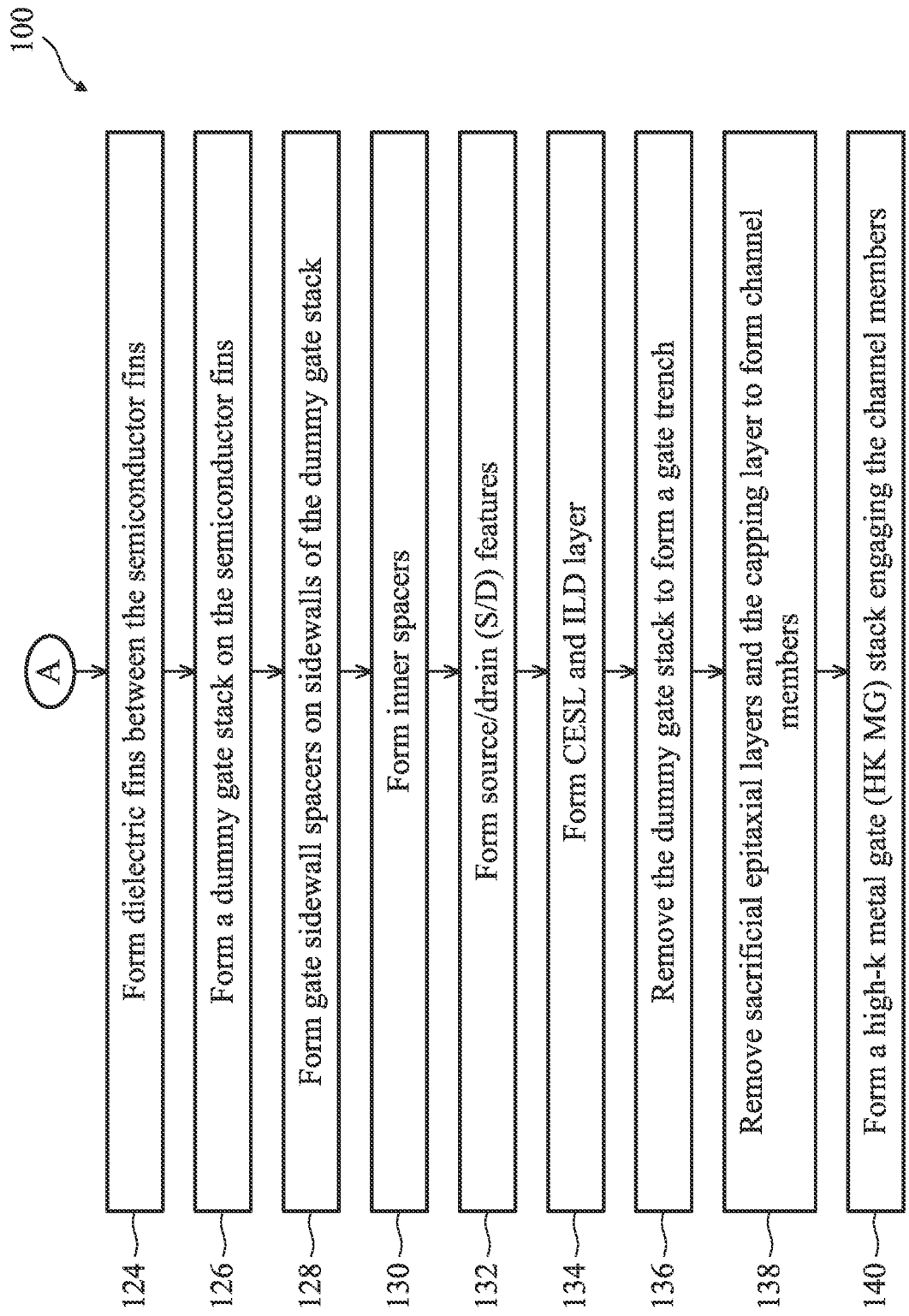

Illustrated in FIGS. 1A and 1B is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-13D. FIGS. 2A, 3A, 9A, 10A, 11A, 12A, and 13A are perspective views of an embodiment of a semiconductor device 200 according to various stages of the method 100 of FIGS. 1A and 1B. FIGS. 2B, 3B, 4, 5, 6, 7, 8, 9B, 10B, 11B, 12B, and 13B are corresponding cross-sectional views of an embodiment of the semiconductor device 200 along a first cut (e.g., cut B-B in FIG. 9A), which is in the gate region and perpendicular to the lengthwise direction of the channel. FIGS. 9C, 10C, 11C, 12C, and 13C are corresponding cross-sectional views of an embodiment of the semiconductor device 200 along a second cut (e.g., cut C-C in FIG. 9A), which is in the channel region and along a lengthwise direction of the channel. FIGS. 9D, 10D, 11D, 12D, and 13D are corresponding cross-sectional views of an embodiment of the semiconductor device 200 along a third cut (e.g., cut D-D in FIG. 9A), which is in a gate region approximate to the channel and along a lengthwise direction of the channel.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including P-FETs, N-FETs, etc., which may be interconnected. Moreover, it is noted that the process steps of method 100, including any descriptions given with reference to FIGS. 2A-13D, as with the remainder of the method and exemplary figures provided in this disclosure, are merely exemplary and are not intended to be limiting beyond what is specifically recited in the claims that follow.

The method 100 at operation 102 (FIG. 1A) provides (or is provided with) a semiconductor device (or device) 200. Referring to FIGS. 2A and 2B, the device 200 includes a substrate 202 and an epitaxial stack 204 above the substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 cm-3 to about 1×1017 cm-3), where for example, no intentional doping is performed during the epitaxial growth process. By way of example, epitaxial growth of the epitaxial layers 206, 208 of the first composition or the second composition may be performed by a molecular beam epitaxy (MBE) process, a metalorganic chemical vapor deposition (MOCVD) process, and/or other suitable epitaxial growth processes. In various embodiments, the substrate 202 is a crystalline substrate, and the epitaxial layers 206, 208 are crystalline semiconductor layers.

In some embodiments, each epitaxial layer 206 has a thickness ranging from about 2 nanometers (nm) to about 6 nm. The epitaxial layers 206 may be substantially uniform in thickness. Yet in the illustrated embodiment, the top epitaxial layer 206 is thinner (e.g., half the thickness) than other epitaxial layers 206 thereunder. The top epitaxial layer 206 functions as a capping layer providing protections to other epitaxial layers in subsequent processes. In some embodiments, each epitaxial layer 208 has a thickness ranging from about 6 nm to about 12 nm. In some embodiments, the epitaxial layers 208 of the stack are substantially uniform in thickness. As described in more detail below, the epitaxial layers 208 or portions thereof may form channel member(s) of the subsequently-formed multi-gate device 200 and the thickness is chosen based on device performance considerations. The term channel member(s) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel regions(s) may eventually be removed and serve to define a vertical distance between adjacent channel members for a subsequently-formed multi-gate device and the thickness is chosen based on device performance considerations. Accordingly, the epitaxial layers 206 may also be referred to as sacrificial layers, and epitaxial layers 208 may also be referred to as channel layers.

It is noted that four (4) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1A) where semiconductor fins (also referred to as device fins or fin elements) are formed by patterning. With reference to the example of FIGS. 3A and 3B, in an embodiment of operation 104, a plurality of semiconductor fins 210 extending from the substrate 202 are formed. In various embodiments, each of the semiconductor fins 210 includes a substrate portion 203 formed from the substrate 202 and an epitaxial stack portion 204 formed from portions of each of the epitaxial layers of the epitaxial stack including epitaxial layers 206 and 208. The semiconductor fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the semiconductor fins 210. In some embodiments, the HM layer 212 includes an oxide layer 212A (e.g., a pad oxide layer that may include $SiO_2$) and a nitride layer 212B (e.g., a pad nitride layer that may include $Si_3N_4$) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The semiconductor fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending semiconductor fins 210. The trenches 214 may be etched using dry etching, wet etching, RIE, and/or other suitable processes.

Numerous other embodiments of methods to form the semiconductor fins on the substrate may also be used including, for example, defining the fin region (e.g., by mask or isolation regions) and epitaxially growing the epitaxial stack 204 in the form of the semiconductor fins 210. In some embodiments, forming the semiconductor fins 210 may include a trim process to decrease the width of the semiconductor fins 210. The trim process may include wet and/or dry etching processes.

Figure 4:
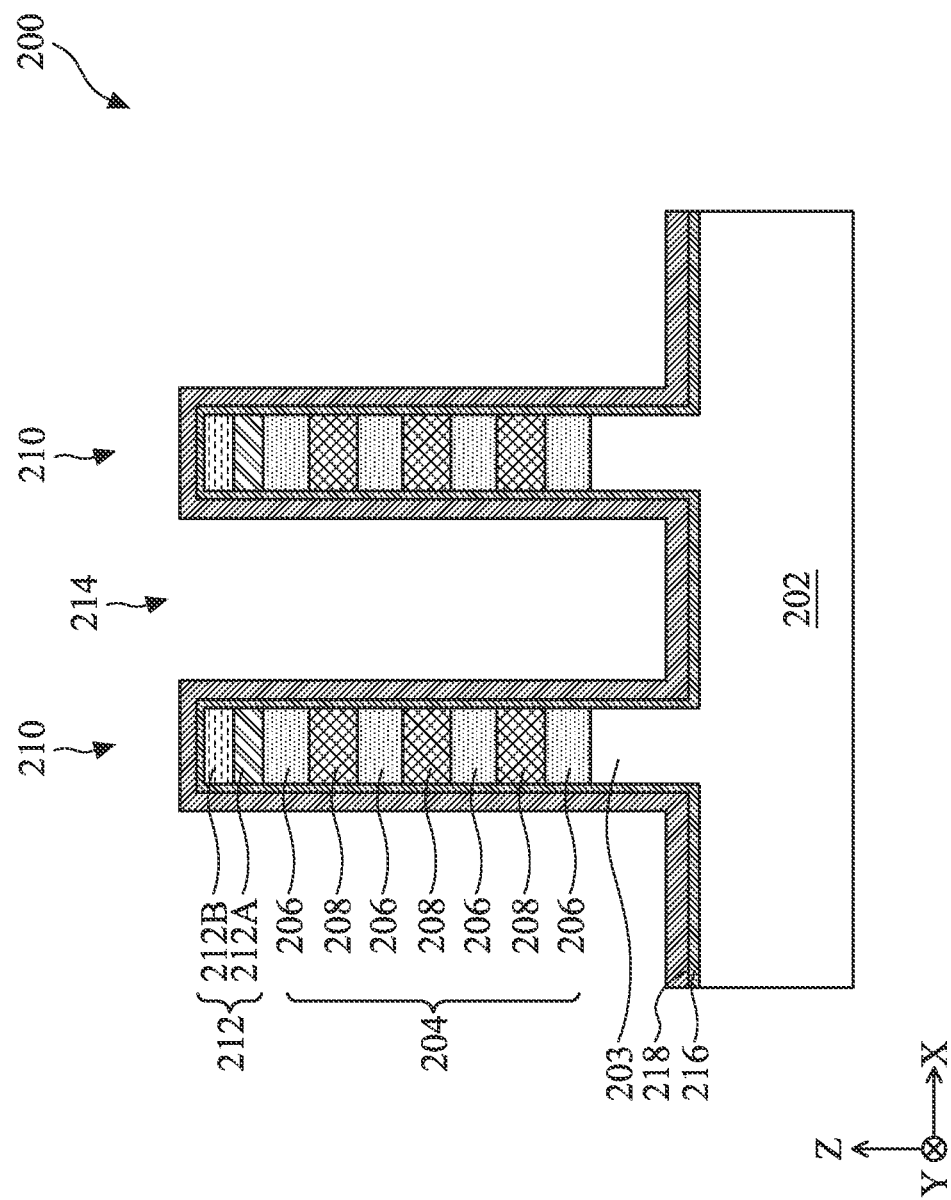

At operation 106, the method 100 (FIG. 1A) forms a passivation liner along top and sidewall surfaces of the semiconductor fins 210. Referring to FIG. 4, in the illustrated embodiment, the passivation liner 216 is an oxide layer (e.g., $SiO_2$) formed by oxidizing exposed surfaces of the semiconductor fins 210 and the substrate 202. The oxidation process results in the oxide layer having a determined thickness. For example, the oxide layer may have a thickness from about 1 nm to about 3 nm. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The $O_3$ may have a concentration of about 1 ppm to about 50 ppm.

At operation 108, the method 100 (FIG. 1A) deposits a semiconductor liner on the passivation liner 216. Still referring to FIG. 4, the semiconductor liner 218 is disposed conformally on top and sidewall surfaces of the semiconductor fins 210. The term "conformally" may be used herein for ease of description upon a layer having substantial same thickness over various regions. By way of example, the semiconductor liner 218 may be formed by depositing a semiconductor material over the passivation liner 216 using processes such as, CVD process, a subatmospheric CVD (SACVD) process, a flowable CVD process, an ALD process, a PVD process, or other suitable process. In some embodiments, the semiconductor liner 218 may have a thickness from about 2 nm to about 5 nm. Due to the underneath passivation liner 216, the crystalline structures in the epitaxial layers 206, 208 and the substrate would not extend into the semiconductor composition in the semiconductor liner 218. The material structure form of the semiconductor composition in the semiconductor liner 218 stays in amorphous form instead. In some embodiments, the semiconductor liner 218 includes amorphous silicon and may also be referred to as an amorphous silicon layer. As will be explained in detail below, the semiconductor liner 218 functions as a seed layer, allowing an amorphous or polycrystalline semiconductor layer (i.e., subsequently-formed sacrificial capping layer) to be deposited thereon.

Figure 5:
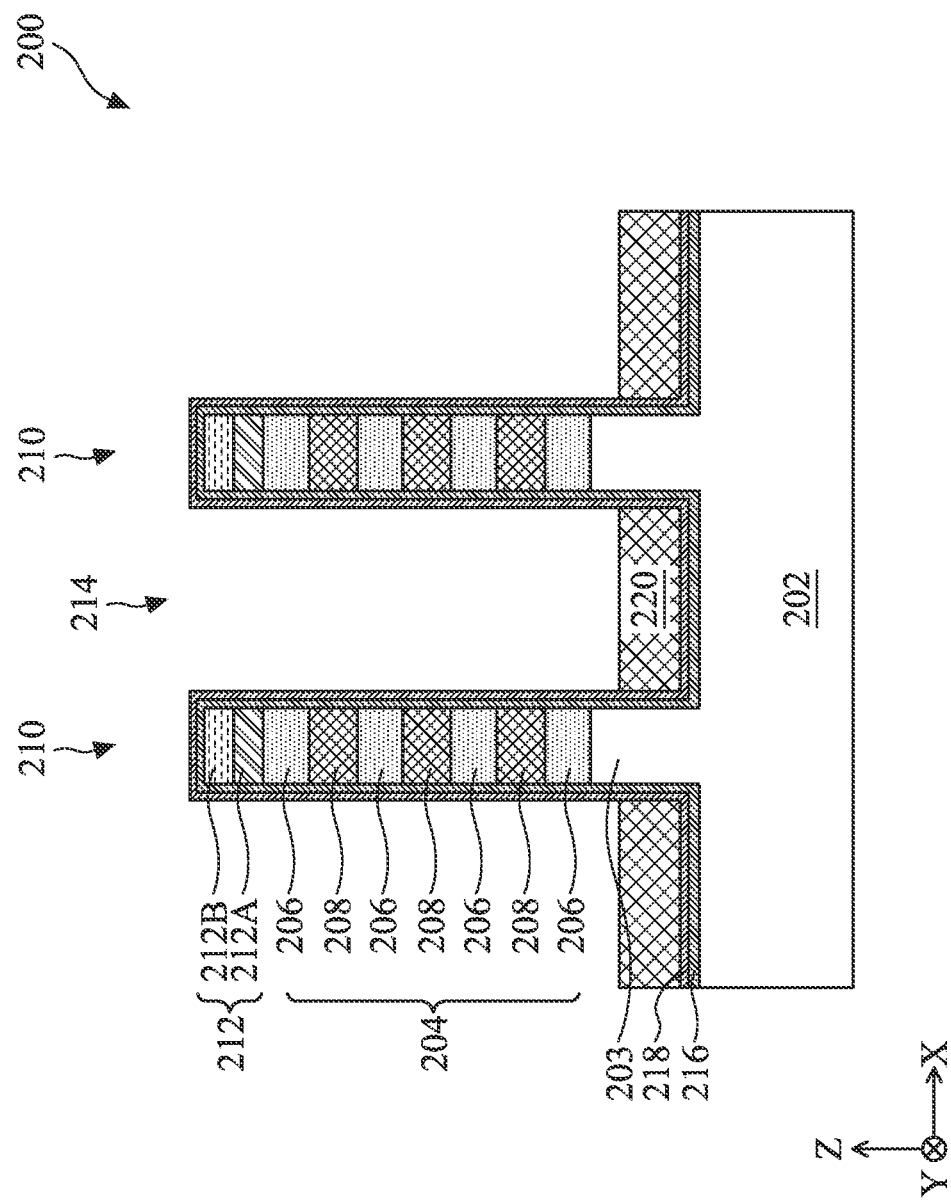

At operation 110, the method 100 (FIG. 1A) forms isolation features, such as shallow trench isolation (STI) features, between the semiconductor fins 210. Referring to FIG. 5, STI features 220 is disposed on the substrate 202 interposing the semiconductor fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers. A surface portion of the semiconductor liner 218 may intermix with the dielectric layer, resulting in a reduced thickness of the semiconductor liner 218. For example, the semiconductor liner 218 may lose over half in its thickness. A reduced thickness of the semiconductor liner 218 may range from about 1 nm to about 3 nm. In one embodiment, the semiconductor liner 218 has a reduced thickness less than the passivation liner 216 after operation 110.

In some embodiments of forming the isolation (STI) features, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the semiconductor fins 210 are recessed. Referring to the example of FIG. 5, the STI features 220 are recessed providing the semiconductor fins 210 extending above the STI features 220. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the semiconductor fins 210. In the illustrated embodiment, the desired height exposes each of the layers of the epitaxial stack 204. In furtherance of the embodiment, a top surface of the STI features 220 is recessed below the bottommost epitaxial layer 206.

Figure 6:
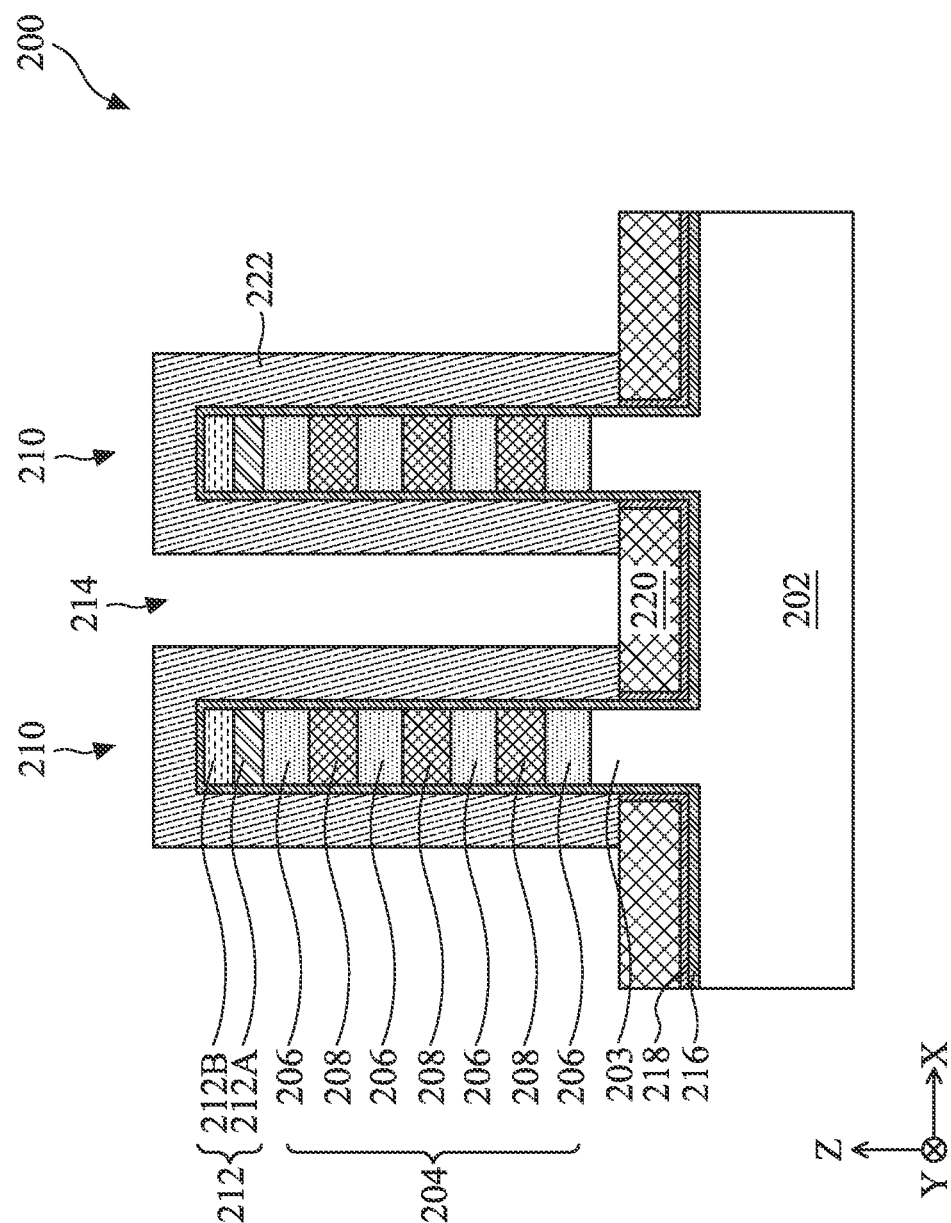
Figure 7:
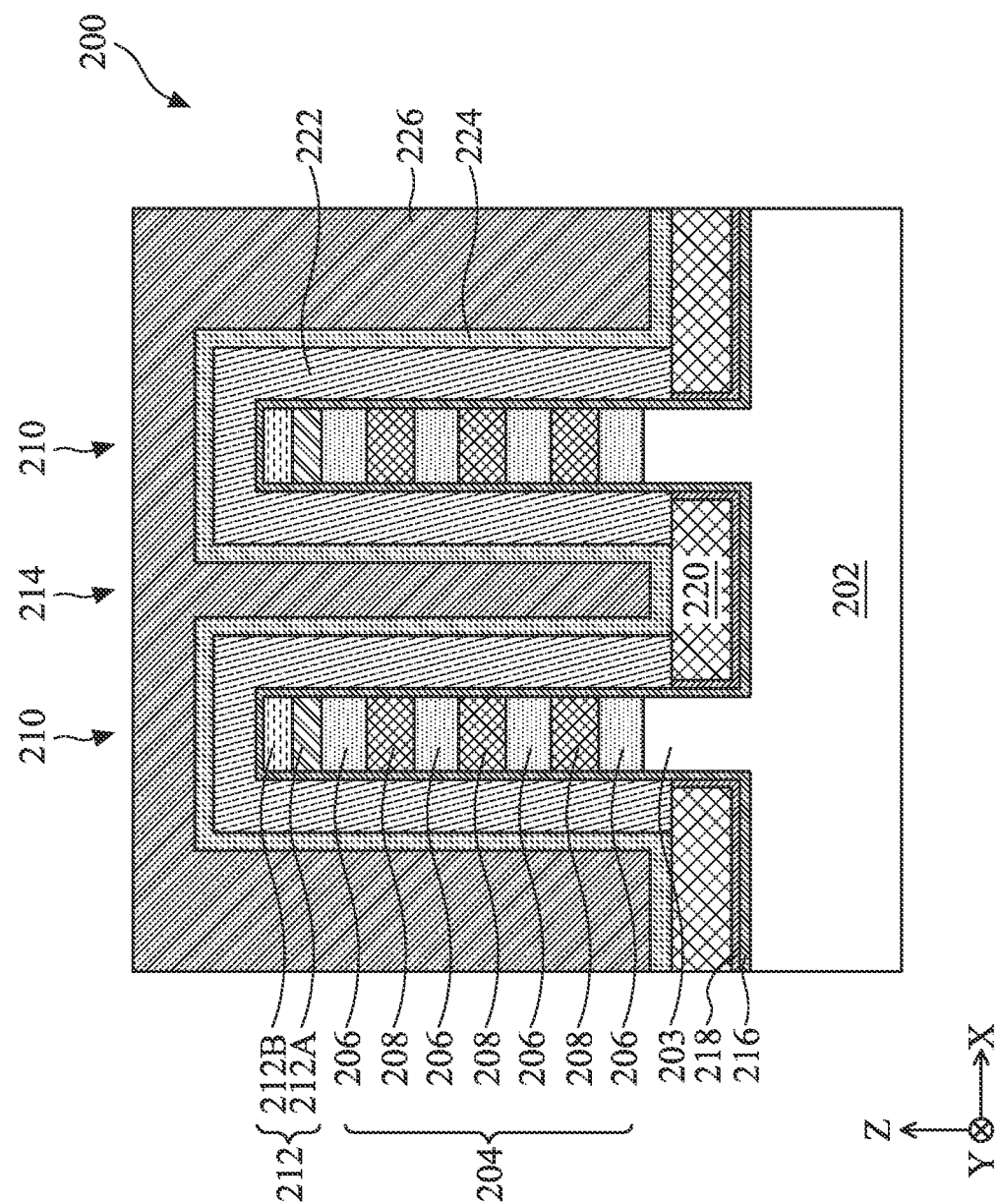
Figure 8:
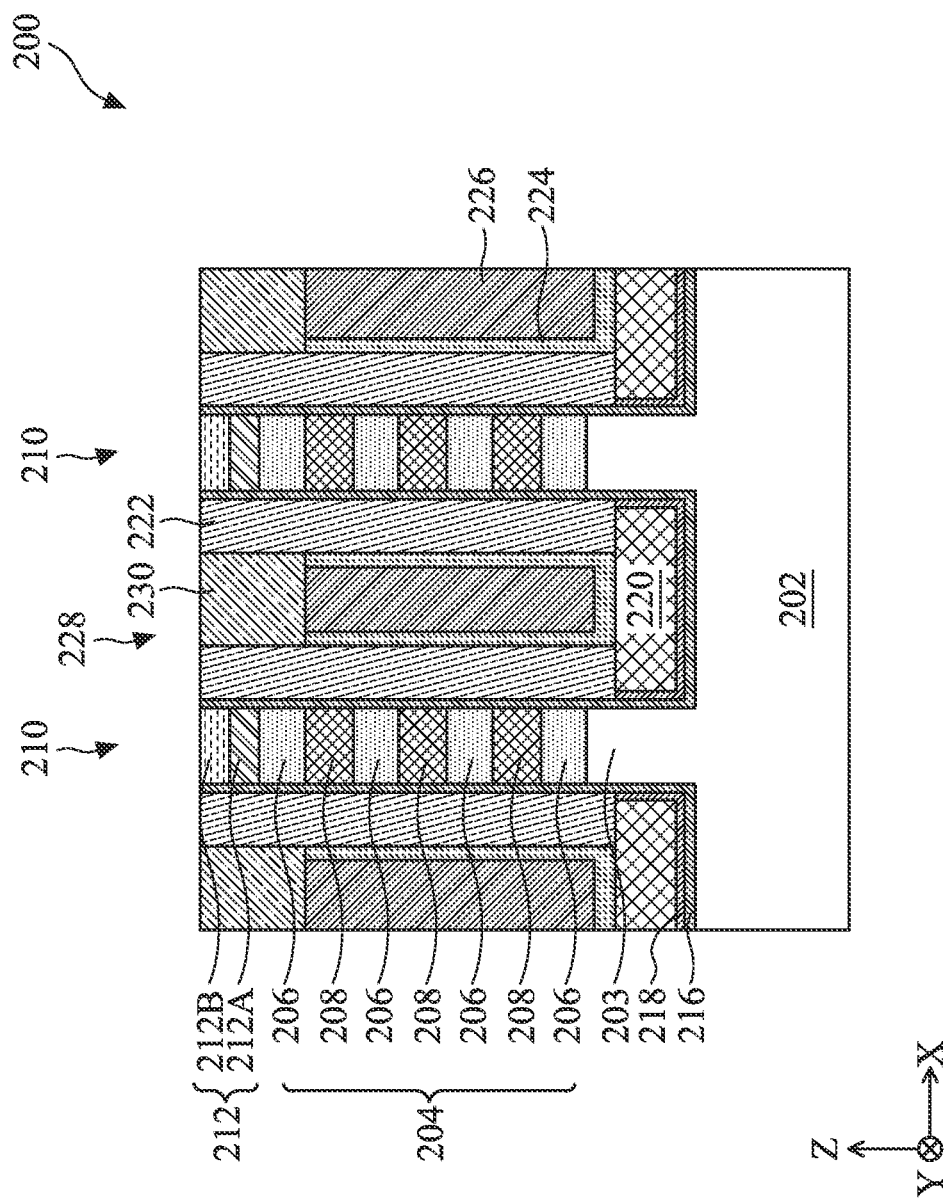

At operation 112, the method 100 (FIG. 1A) deposits a capping layer on top and sidewall surfaces of the semiconductor fins. Referring to FIG. 6, in the illustrated embodiment, the capping layer 222 is selectively deposited over the device 200. In particular, the capping layer 222 may be selectively and conformally deposited over the exposed surfaces of the semiconductor liner 218. In various embodiments, the capping layer 222 is not deposited on top surfaces of the STI features 220 between the semiconductor fins 210. For example, the capping layer 222 may be a semiconductor layer and deposited by an epitaxial growing process, such that the epitaxial growth of the capping layer 222 is limited to exposed semiconductor surfaces of the semiconductor liner 218, which functions as a seed layer, but not on dielectric material surfaces of the STI features 220. In some embodiments, during the epitaxial growing process, the semiconductor liner 218 intermixes with the capping layer 222 and becomes a portion of the capping layer 222. Therefore, portions of the semiconductor liner 218 above the STI features 220 are not shown in FIG. 6. Alternatively, the semiconductor liner 218 with a further reduced thickness (not shown in FIG. 6) may remain underneath the capping layer 222, in some embodiments. By way of example, the capping layer 222 may be deposited by an MBE process, an MOCVD process, an ALD process, and/or other suitable epitaxial growth processes. In furtherance of the example, the semiconductor liner 218 is an amorphous silicon layer, and the capping layer 222 includes the same semiconductor material as the epitaxial layer 206, such as silicon germanium (SiGe). Due to the amorphous form of the seed layer, the semiconductor material in the capping layer 222 won't grow in crystalline structures but in either amorphous form or polycrystalline form instead, such as amorphous SiGe or polycrystalline SiGe in some embodiments. In yet some embodiments, the capping layer 222 may have a mixture of semiconductor material in both amorphous form and polycrystalline form, such as 60% SiGe in amorphous form and 40% SiGe in polycrystalline form. The term "amorphous or polycrystalline" is used herein to designate composition in amorphous form, polycrystalline form, or a combination thereof. As will be explained in detail below, the capping layer 222 reserves a space for subsequently-formed metal gate stack and will be removed in a subsequent processing stage. Therefore, the capping layer 222 is also referred to as a sacrificial capping layer.

At operation 124, the method 100 (FIG. 1B) forms a dielectric fin between adjacent semiconductor fins. Referring to the example of FIGS. 7 and 8, in an embodiment of operation 124, a dielectric layer 224 is deposited conformally within the trenches 214 including along sidewalls of the sacrificial capping layer 222 and along a top surface of the STI features 220. Thereafter, a dielectric layer 226 is deposited over the dielectric layer 224. In at least some embodiments, the dielectric layers 224, 226 may collectively define a dielectric fin 228 (or hybrid fin 228). However, in some cases, a dielectric fin 228 may further include a high-K dielectric layer formed over the dielectric layers 224, 226, for example after recessing of the dielectric layers 224, 226, as discussed below. Generally, and in some embodiments, the dielectric layers 224, 226 may include SiN, SiCN, SiOC, SiOCN, SiOx, or other appropriate material. In some examples, the dielectric layer 224 may include a low-K dielectric layer, and the dielectric layer 226 may include a flowable oxide layer. In various cases, the dielectric layers 224, 226 may be deposited by a CVD process, an ALD process, a PVD process, a spin-coating and baking process, and/or other suitable process. In some examples, after depositing the dielectric layers 224, 226, a CMP process may be performed to remove excess material portions and to planarize a top surface of the device 200.

The method 200 at operation 124 may further include a recessing process, a high-K dielectric layer deposition process, and a CMP process. Still referring to FIGS. 7 and 8, in an embodiment of operation 124, a recessing process is performed to remove top portions of the dielectric layers 224 and 226. In some embodiments, the recessing process may include a dry etching process, a wet etching process, and/or a combination thereof. In some embodiments, a recessing depth is controlled (e.g., by controlling an etching time) to result in a desired recess depth. In some embodiments, the recessing process may optionally remove at least part of the sacrificial capping layer 222. After performing the recessing process, and in a further embodiment of operation 124, a high-K dielectric layer 230 is deposited within trenches formed by the recessing process. In some embodiments, the high-K dielectric layer 230 may include $HfO_2$, $ZrO_2$, HfAlOx, HfSiOx, $Y_2O_3$, $Al_2O_3$, or another high-K material. The high-K dielectric layer 230 may be deposited by a CVD process, an ALD process, a PVD process, and/or other suitable process. After deposition of the high-K dielectric layer 230, and in a further embodiment of operation 124, a CMP process is performed to remove excess material portions and to planarize a top surface of the device 200. In some examples, the CMP process removes a portion of the sacrificial capping layer 222 from the top of the semiconductor fins 210 to expose the HM layer 212. Thus, in various cases, a dielectric fin 228 is defined as having a lower portion including the recessed portions of the dielectric layers 224, 226 and an upper portion including the high-K dielectric layer 230. In some examples, a height of the high-K dielectric layer 230 may be about 10-30 nm. In some cases, the dielectric fin 228 may be alternatively described as a bi-layer dielectric having a high-K upper portion and a low-K lower portion. In some examples, a height ratio of the upper portion to the lower portion may be about 1:20 to about 20:1. The height ratio may be adjusted, for example, by changing the recess depth and thus the height of the high-K dielectric layer 230, as noted above. In some embodiments, the dielectric fins 228 are used to effectively prevent the undesirable lateral merging of the epitaxial S/D features formed on adjacent semiconductor fins 210, as will be discussed in more detail below.

The method 100 then proceeds to operation 126 (FIG. 1B) where sacrificial layers/features are formed and in particular, a dummy gate structure. While the present discussion is directed to a replacement gate (or gate-last) process whereby a dummy gate structure is formed and subsequently replaced, other configurations may be possible.

Figure 9B:
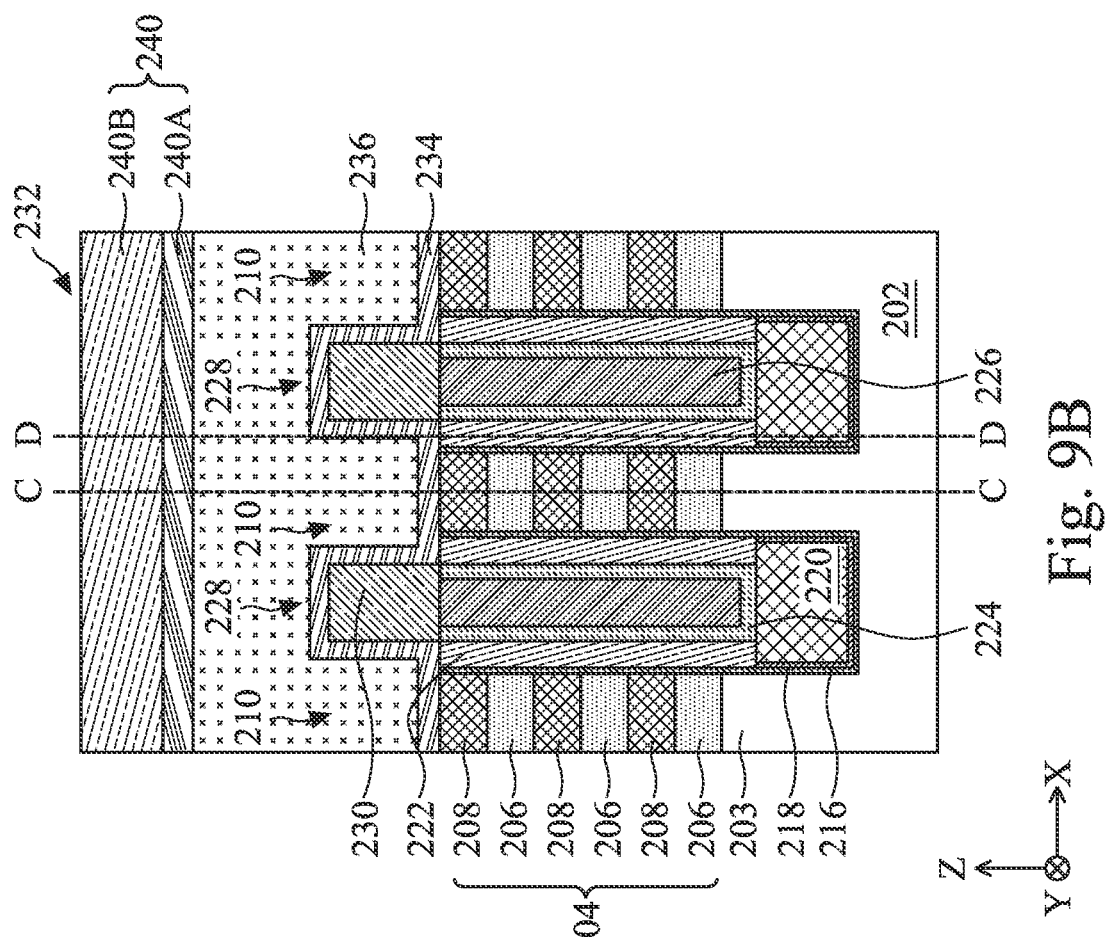
Figure 9A:
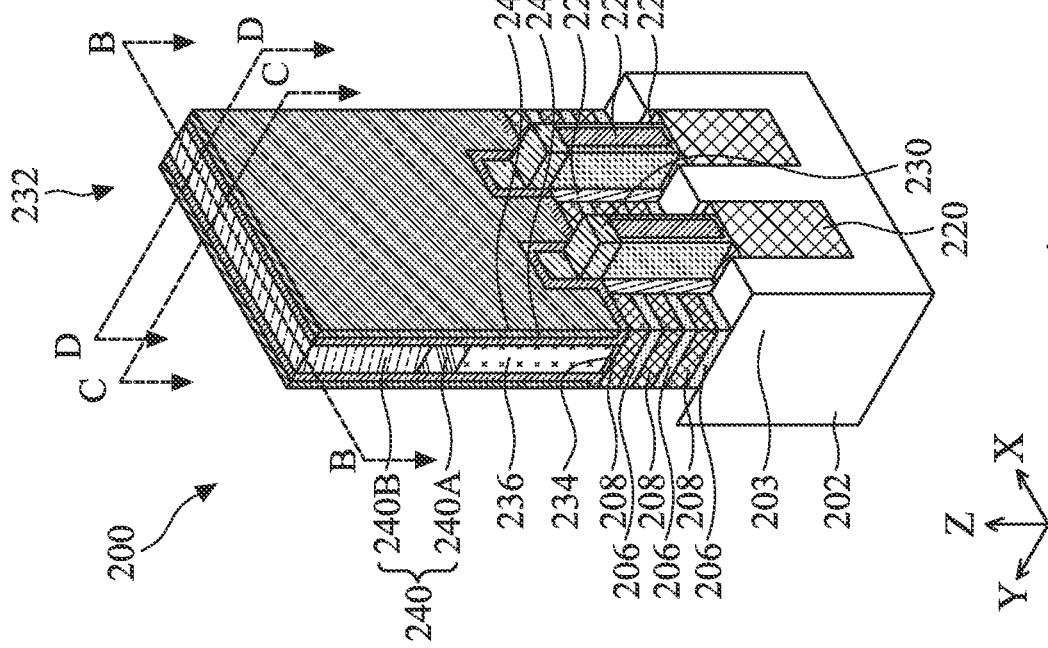

With reference to FIGS. 9A-9D, a gate stack 232 is formed. FIG. 9A is a perspective view of the device 200, FIG. 9B refers to a cross-sectional view taken in the gate region and perpendicular to a lengthwise direction of the channel (e.g., along the B-B line), FIG. 9C refers to a cross-sectional view taken in the channel region and along the lengthwise direction of the channel (e.g., along the C-C line), and FIG. 9D refers to a cross-sectional view taken though the sacrificial capping layer 222 and along the lengthwise direction of the channel (e.g., along the D-D line). In an embodiment, the gate stack 232 is a dummy (sacrificial) gate stack that is subsequently removed (with reference to operation 136). Thus, in some embodiments using a gate-last process, the gate stack 232 is a dummy gate stack and will be replaced by the final gate stack at a subsequent processing stage of the device 200. In particular, the dummy gate stack 232 may be replaced at a later processing stage by a high-K dielectric layer (HK) and metal gate electrode (MG) as will be discussed in more detail below.

In an embodiment of operation 126, the HM layer 212 and a top portion of the sacrificial capping layer 222 may initially be etched-back. The topmost epitaxial layer 206 may act as an etch stop layer for etching the HM layer 212 and be subsequently removed. The top potion of the sacrificial capping layer 222 may be removed together with the topmost epitaxial layer 206 by the same etchant that targets the same semiconductor material, such as SiGe. In some embodiments, a top surface of the etched-back sacrificial capping layer 222 is substantially level with top surfaces of the topmost epitaxial layer 208 of the semiconductor fins 210. In some embodiments, the etch-back of the HM layer 212 and the top portion of the sacrificial capping layer 222 may be performed using a wet etch process, a dry etch process, a multiple-step etch process, and/or a combination thereof. The HM layer 212 may be removed, for example, by a wet etching process using $H_3PO_4$ or other suitable etchants. After performing the etch-back process, and in a further embodiment of operation 126, the dummy gate stack 232 is disposed over the semiconductor fins 210, the sacrificial capping layer 222, and the dielectric fins 228. The portion of the semiconductor fins 210 underlying the dummy gate stack 232 may be referred to as the channel region. The dummy gate stack 232 may also define source/drain (S/D) regions of the semiconductor fins 210, for example, the regions of the semiconductor fin 210 adjacent and on opposing sides of the channel region.

In some embodiments, the dummy gate stack 232 includes a dummy dielectric layer 234 and a dummy electrode layer 236. In some embodiments, the dummy dielectric layer 234 may include $SiO_2$, silicon nitride, a high-K dielectric material and/or other suitable material. In various examples, the dummy dielectric layer 234 may be deposited by a CVD process, a subatmospheric CVD (SACVD) process, a flowable CVD process, an ALD process, a PVD process, or other suitable process. By way of example, the dummy dielectric layer 234 may be used to prevent damages to the semiconductor fins 210 by subsequent processes (e.g., subsequent formation of the dummy gate stack). Subsequently, other portions of the dummy gate stack 232 are formed, including a dummy electrode layer 236 and a hard mask 240 which may include multiple layers 240A and 240B (e.g., an oxide layer 240A and a nitride layer 240B). In some embodiments, the dummy gate stack 232 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy electrode layer 236 may include polycrystalline silicon (polysilicon). In some embodiments, the hard mask 240 includes an oxide layer 240A such as a pad oxide layer that may include $SiO_2$. In some embodiments, hard mask 240 includes a nitride layer 240B such as a pad nitride layer that may include $Si_3N_4$, silicon oxynitride and/or silicon carbide. In some embodiments, after formation of the dummy gate stack 232, the dummy dielectric layer 234 is removed from the S/D regions of the semiconductor fins 210. The etch process may include a wet etch, a dry etch, and/or a combination thereof. The etch process is chosen to selectively etch the dummy dielectric layer 234 without substantially etching the semiconductor fins 210, the hard mask 240, and the dummy electrode layer 236.

At operation 128, the method 100 (FIG. 1B) forms sidewall spacers on sidewall surfaces of the dummy gate stacks. Still referring to FIGS. 9A-9D, the sidewall spacers 242 may have a thickness of about 2-10 nm. In some examples, the sidewall spacers 242 may include a dielectric material such as silicon oxide, silicon nitride, silicon carbide, silicon oxynitride, SiCN, silicon oxycarbide, SiOCN, a low-K material, and/or combinations thereof. In some embodiments, the sidewall spacers 242 include multiple layers, such as a liner spacer layer 242A and a main spacer layer 242B, and the like. By way of example, the sidewall spacers 242 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the sidewall spacers 242 may be etched-back to expose portions of the semiconductor fins 210 not covered by the dummy gate stacks 232 (e.g., for example, in source/drain regions). In some cases, the etch-back process removes portions of dielectric material used to form the sidewall spacers 242 along a top surface of the dummy gate stack 232, thereby exposing the hard mask layer 240. In some embodiments, the etch-back process may include a wet etch process, a dry etch process, a multiple-step etch process, and/or a combination thereof. It is noted that after the etch-back process, the sidewall spacers 242 remain disposed on sidewall surfaces of the dummy gate stack 232.

At operation 130, the method 100 (FIG. 1B) forms inner spacers. Still referring to FIGS. 9A-9D, in some embodiments of operation 130, a source/drain etch process is performed prior to the forming of inner spacers. A source/drain etch process is performed to remove portions of the semiconductor fins 210 and the sacrificial capping layer 222 not covered by the dummy gate stack 232 (e.g., in source/drain regions) and that were previously exposed (e.g., during the sidewall spacer 242 etch-back process). In particular, the source/drain etch process may serve to remove the exposed epitaxial layer portions 206, 208 in source/drain regions of the device 200 (as well as the passivation liner 216) to expose underlying substrate portions 203 of the semiconductor fins 210. In some embodiments, the source/drain etch process may include a dry etching process, a wet etching process, and/or a combination thereof.

Figure 10B:
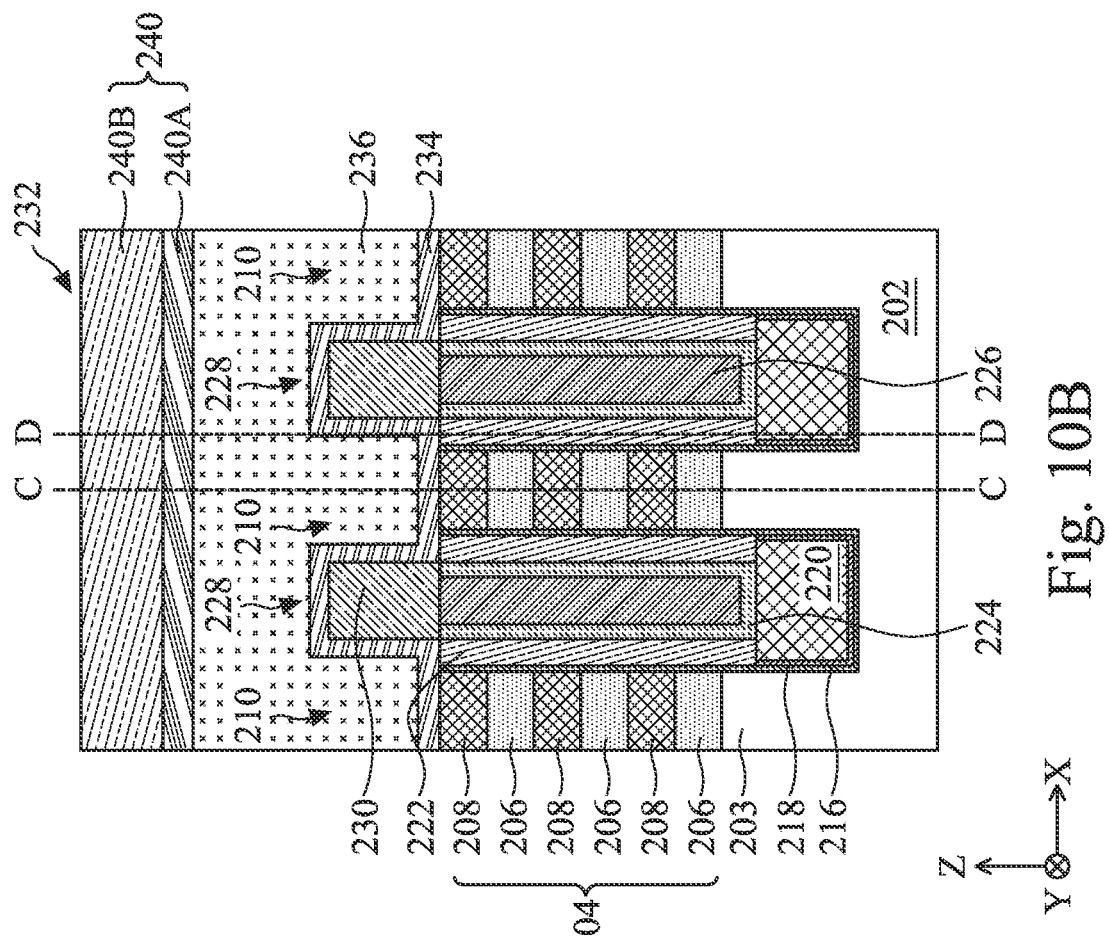
Figure 10A:
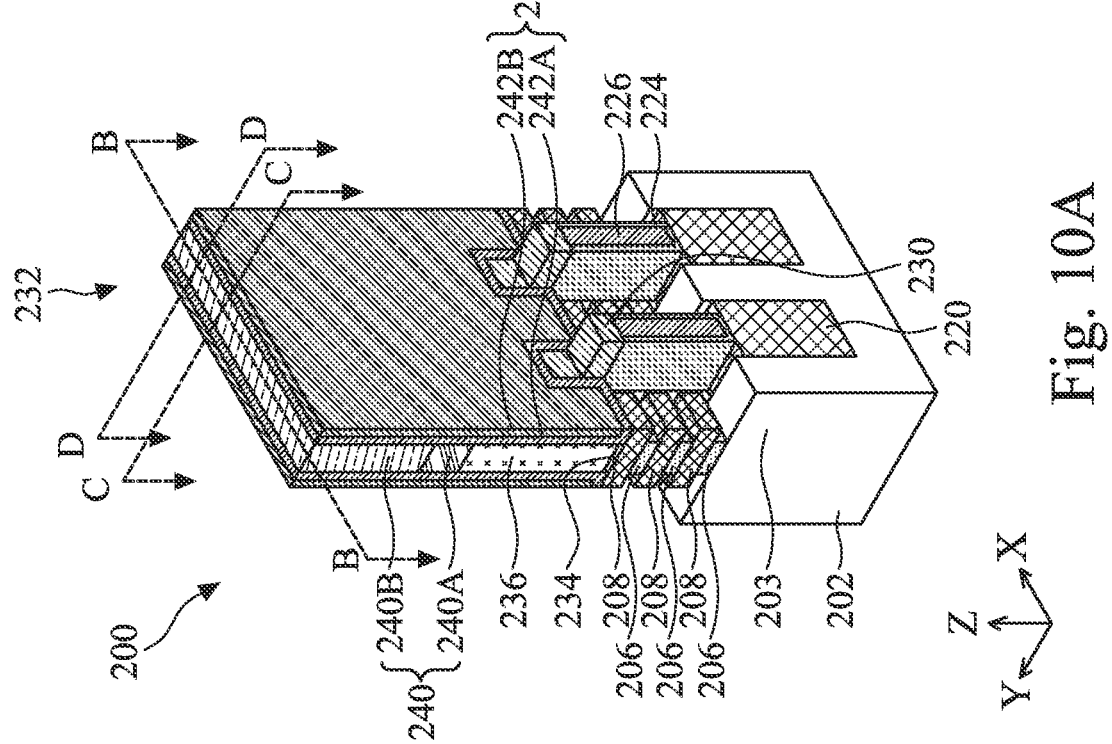
Figures 10C, 10D:
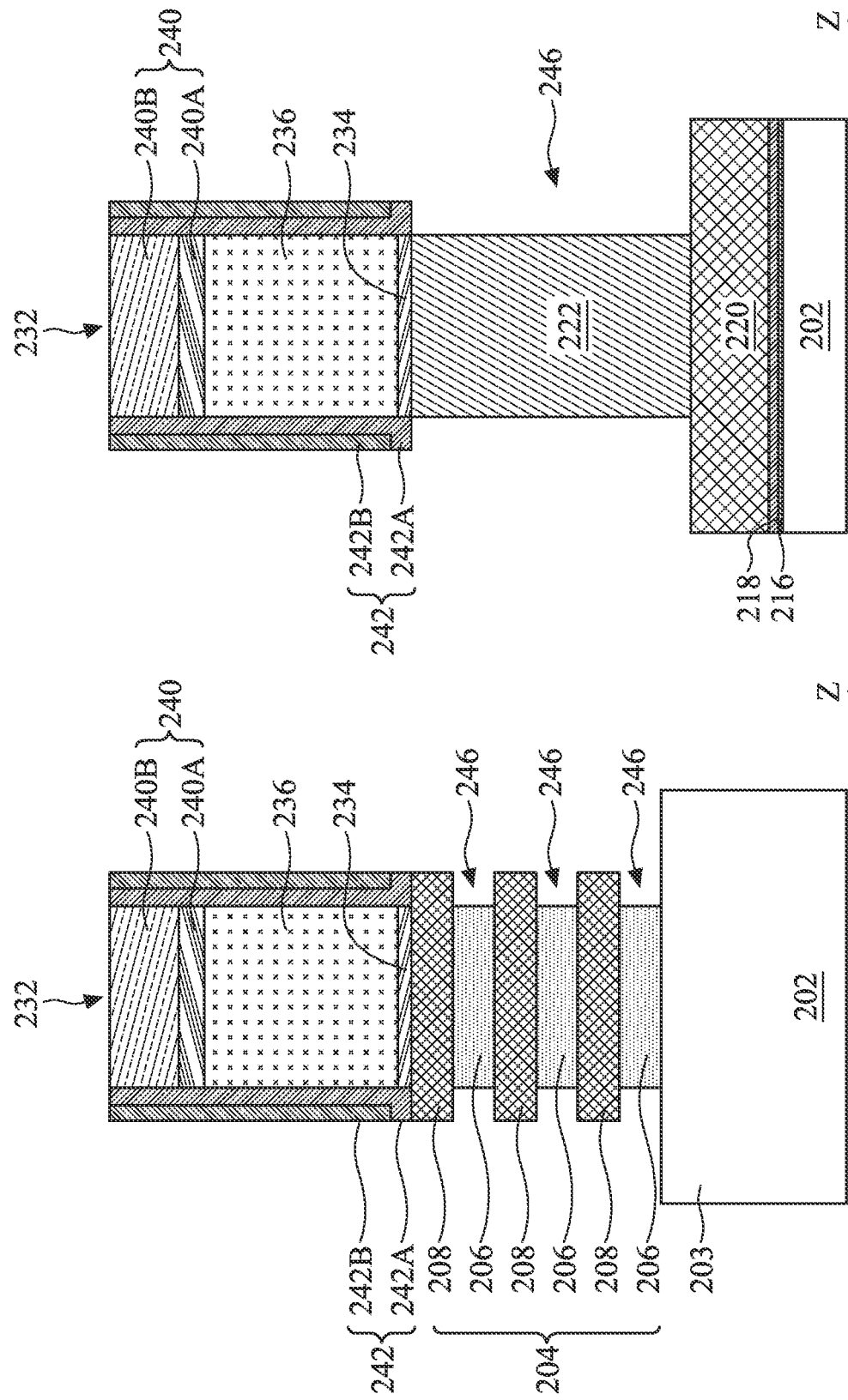

Referring to FIGS. 10A-10D, in some embodiments of operation 130, a lateral etching (or horizontal recessing) is subsequently performed to recess the epitaxial layers 206 and the sacrificial capping layer 222 to form recesses 246. FIG. 10A is a perspective view of the device 200, FIG. 10B refers to a cross-sectional view taken in the gate region and perpendicular to a lengthwise direction of the channel (e.g., along the B-B line), FIG. 10C refers to a cross-sectional view taken in the channel region and along the lengthwise direction of the channel (e.g., along the C-C line), and FIG. 10D refers to a cross-sectional view taken though the sacrificial capping layer 222 and along the lengthwise direction of the channel (e.g., along the D-D line). The amount of etching of the epitaxial layers 206 and the sacrificial capping layer 222 is in a range from about 2 nm to about 10 nm in some embodiments. In furtherance of some embodiments, end portions (edges) of the epitaxial layer 206 and the sacrificial capping layer 222 under the dummy gate stack 232 are substantially flush with the sidewall surfaces of the dummy electrode layer 236. Here, "being substantially flush" means the difference in the relative position is less than about 1 nm. When the epitaxial layers 206 are crystalline SiGe and the sacrificial capping layer 222 is amorphous or polycrystalline SiGe, the lateral etching process may use the same etchant, such as, but not limited to, ammonium hydroxide ($NH_4OH$), tetramethylammonium hydroxide (TMAH), ethylenediamine pyrocatechol (EDP), or potassium hydroxide (KOH) solutions.

Referring to FIGS. 11A-11D, in some embodiments of operation 130, an insulating layer is subsequently formed on the lateral ends of the epitaxial layers 206 and the sacrificial capping layer 222 to fill the recesses 246, thereby forming inner spacers 248. FIG. 11A is a perspective view of the device 200, FIG. 11B refers to a cross-sectional view taken in the gate region and perpendicular to a lengthwise direction of the channel (e.g., along the B-B line), FIG. 11C refers to a cross-sectional view taken in the channel region and along the lengthwise direction of the channel (e.g., along the C-C line), and FIG. 11D refers to a cross-sectional view taken though the sacrificial capping layer 222 and along the lengthwise direction of the channel (e.g., along the D-D line). The insulating layer may include a dielectric material, such as SiN, SiOC, SiOCN, SiCN, $SiO_2$, and/or other suitable material. In some embodiments, the insulating layer is conformally deposited, for example, by ALD or any other suitable method. After the conformal deposition of the insulating layer, an etch-back process is performed to partially remove the insulating layer from outside of the recesses 246. By this etching the insulating layer remains substantially within the recesses 246. In some examples, the etch-back process may also etch a portion of the high-K dielectric layer 230 of the dielectric fins 228 not covered by the dummy gate stack 232. Since the insulating layer also fills the recesses 246 provided by the recessing of the sacrificial capping layer 222, the inner spacers 248 are continuously connected and wrap around the lateral ends of the epitaxial layers 208 in the channel region. The continuously connected inner spacers 248 may also be referred to jointly as an inner spacer layer.

At operation 132, the method 100 (FIG. 1B) forms S/D features (also referred to as epitaxial S/D features). Still referring to FIGS. 11A-11D, in an embodiment of operation 132, S/D features 250 are formed in S/D regions adjacent to and on either side of the dummy gate stack 232. For example, the S/D features 250 may be formed over the exposed substrate portions 203 of the semiconductor fins 210 and in contact with the adjacent inner spacers 248 and the semiconductor channel layers (the epitaxial layers 208). In the illustrated embodiment, the S/D features 250 is also in contact with a top surface of the STI features 220 and sidewalls of the dielectric fins 228. In some embodiments, the S/D features 250 are formed by epitaxially growing a semiconductor material layer in the S/D regions. In various embodiments, the S/D features 250 may include Ge, Si, GaAs, AlGaAs, SiGe, GaAsP, SiP, or other suitable material. The S/D features 250 may be in-situ doped during the epitaxial process by introducing doping species including: p-type dopants, such as boron or $BF_2$; n-type dopants, such as phosphorus or arsenic; and/or other suitable dopants including combinations thereof. If the S/D features 250 are not in-situ doped, an implantation process (i.e., a junction implant process) is performed to dope the S/D features 250. In an exemplary embodiment, the S/D features 250 in an NMOS device include SiP, while those in a PMOS device include GeSnB and/or SiGeSnB. Furthermore, silicidation or germano-silicidation may be formed on the S/D features 250. For example, silicidation, such as nickel silicide, may be formed by depositing a metal layer over the epitaxial S/D features 250, annealing the metal layer such that the metal layer reacts with silicon in the S/D features 250 to form the metal silicidation, and thereafter removing the non-reacted metal layer. As illustrated in FIG. 11A, the dielectric fins 228, which may have a partially etched-back high-K dielectric layer 230, effectively prevents the undesirable lateral merging of the S/D features 250 formed on adjacent semiconductor fins 210.

Due to the amorphous or polycrystalline form of the semiconductor material in the sacrificial capping layer 222, footing profile 252 (highlighted in a dotted circle in FIG. 11D) of end portions of the sacrificial capping layer 222 has a substantially straight etched surface (sidewall) perpendicular to a top surface of the STI features 220. As a comparison, if the sacrificial capping layer 222 may be formed of crystalline semiconductor material, the etched surface at the footing profile 252 may have a quadrilateral cavity defined by (111) facets. The quadrilateral cavity may cause notches in the footing profile of the inner spacer layer 248 and in turn cause defects, such as pits, in the subsequently-formed S/D features 250. Furthermore, subsequently-formed metal gate structure may also have facets in the footing profile. By forming the sacrificial capping layer 222 with amorphous or polycrystalline semiconductor material, the inner spacer layer 248 has substantially straight sidewalls interfacing the sacrificial capping layer 222 and the S/D features 250 in footing regions. In turn, pits in the S/D features 250 are less likely to form in footing regions.

Figures 12A, 12B:
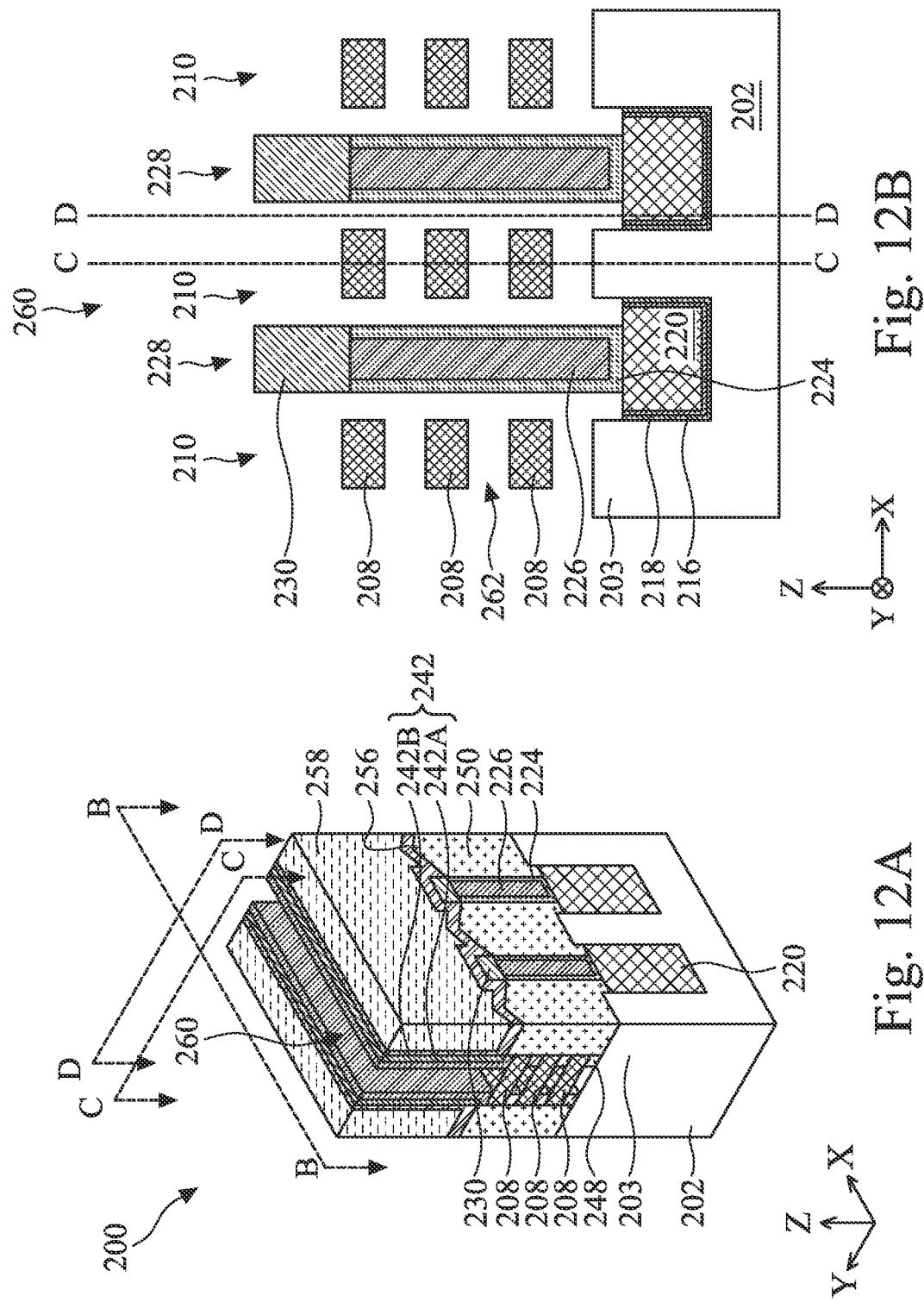
Figures 12C, 12D:
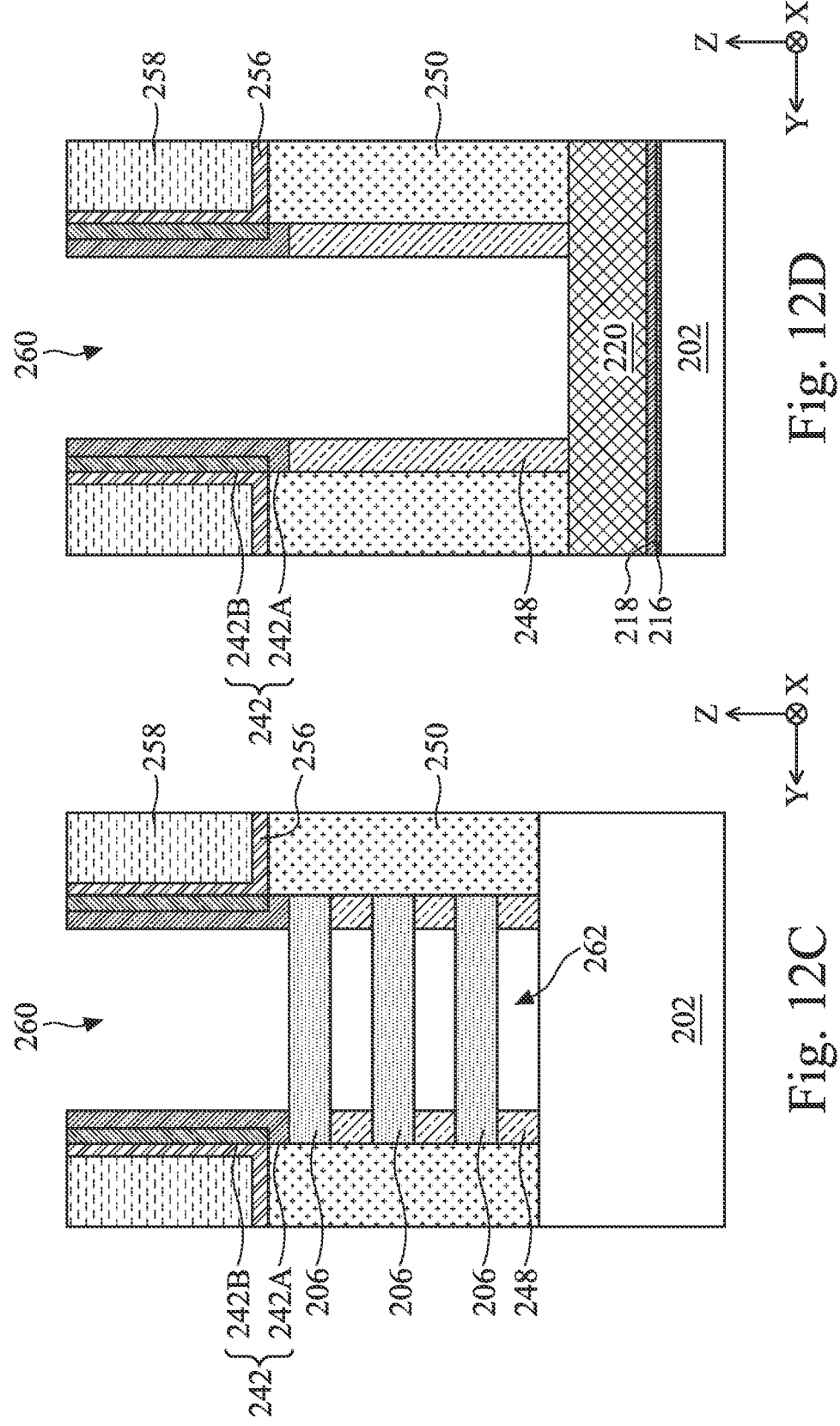

At operation 134, the method 100 (FIG. 1B) forms an inter-layer dielectric (ILD) layer. Referring to FIGS. 12A-12D, in some embodiments of operation 134, a contact etch stop layer (CESL) is also formed prior to forming the ILD layer. FIG. 12A is a perspective view of the device 200, FIG. 12B refers to a cross-sectional view taken in the gate region and perpendicular to a lengthwise direction of the channel (e.g., along the B-B line), FIG. 12C refers to a cross-sectional view taken in the channel region and along the lengthwise direction of the channel (e.g., along the C-C line), and FIG. 12D refers to a cross-sectional view taken though a space reserved by the sacrificial capping layer 222 and along the lengthwise direction of the channel (e.g., along the D-D line). In some examples, the CESL 256 includes a silicon nitride layer, silicon oxide layer, a silicon oxynitride layer, and/or other materials known in the art. The CESL 256 may be formed by plasma-enhanced chemical vapor deposition (PECVD) process and/or other suitable deposition or oxidation processes. In some embodiments, the ILD layer 258 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 258 may be deposited by a PECVD process or other suitable deposition technique. In some embodiments, after formation of the ILD layer 258, the semiconductor device 200 may be subject to a high thermal budget process to anneal the ILD layer.

In some examples, after depositing the ILD layer, a planarization process may be performed to remove excessive dielectric materials. For example, a planarization process includes a chemical mechanical planarization (CMP) process which removes portions of the ILD layer 258 (and CESL 256, if present) overlying the dummy gate stack 232 and planarizes a top surface of the semiconductor device 200. In some embodiments, the CMP process also removes hard mask 240 and exposes the dummy electrode layer 236.

At operation 136, the method 100 (FIG. 1B) removes the dummy gate stack 232 to form a gate trench 260 in the channel region, as shown in FIGS. 12A-12D. A final gate structure (e.g., including a high-K dielectric layer and metal gate electrode) may be subsequently formed in the gate trench 260, as will be described below. Operation 136 may include one or more etching processes that are selective to the material in the dummy gate stack 232. For example, the removal of the dummy gate stack 232 may be performed using a selective etch process such as a selective wet etch, a selective dry etch, or a combination thereof. The epitaxial layers 206 and 208 of the semiconductor fins 210 and the sacrificial capping layer 222 are exposed in the gate trench 260.

At operation 138, the method 100 (FIG. 1B) removes the epitaxial layers 206 from the semiconductor fins 210 and the sacrificial capping layer 222 (as well as the passivation liner 216) in the gate trench 260. The resultant structure 200 is shown in FIGS. 13A-13D. In an embodiment, the epitaxial layers 206 and the sacrificial capping layer 222 both include SiGe (in crystalline structure and amorphous or polycrystalline structure, respectively) and the epitaxial layers 208 are silicon, allowing for the selective removal of the epitaxial layers 206 and the sacrificial capping layer 222. In an embodiment, the epitaxial layers 206 and the sacrificial capping layer 222 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. It is noted that during the interim processing stage of operation 138, gaps 262 are provided between the adjacent channel members (e.g., nanowires or nanosheet) in the channel region (e.g., gaps 262 between epitaxial layers 208). The gaps 262 may be filled with ambient environment conditions (e.g., air, nitrogen).

Figure 13D:
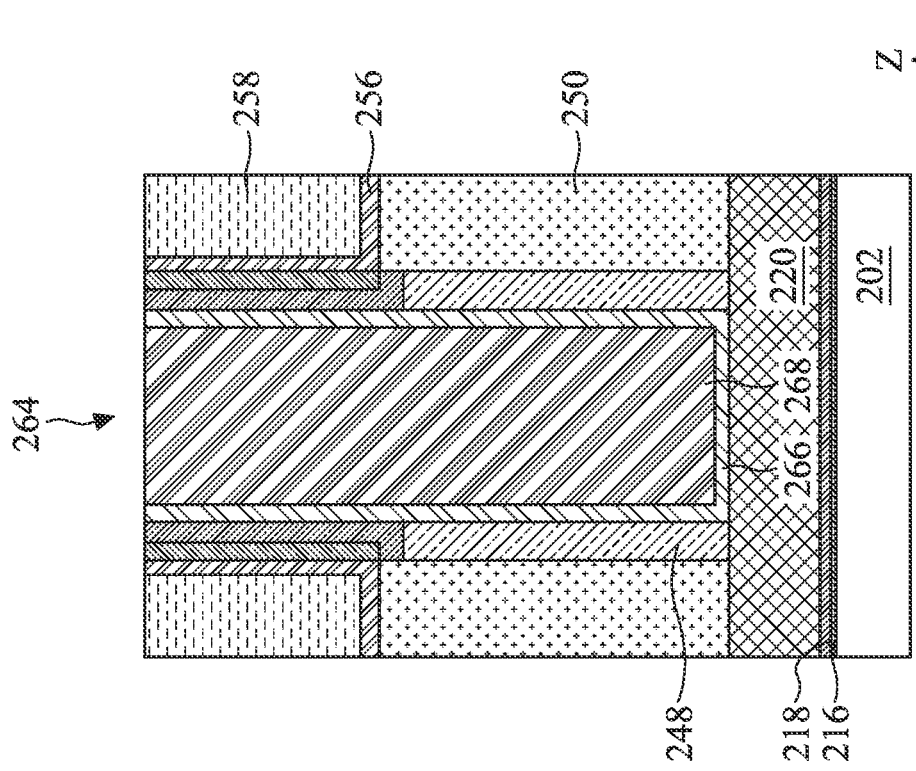
Figure 13C:
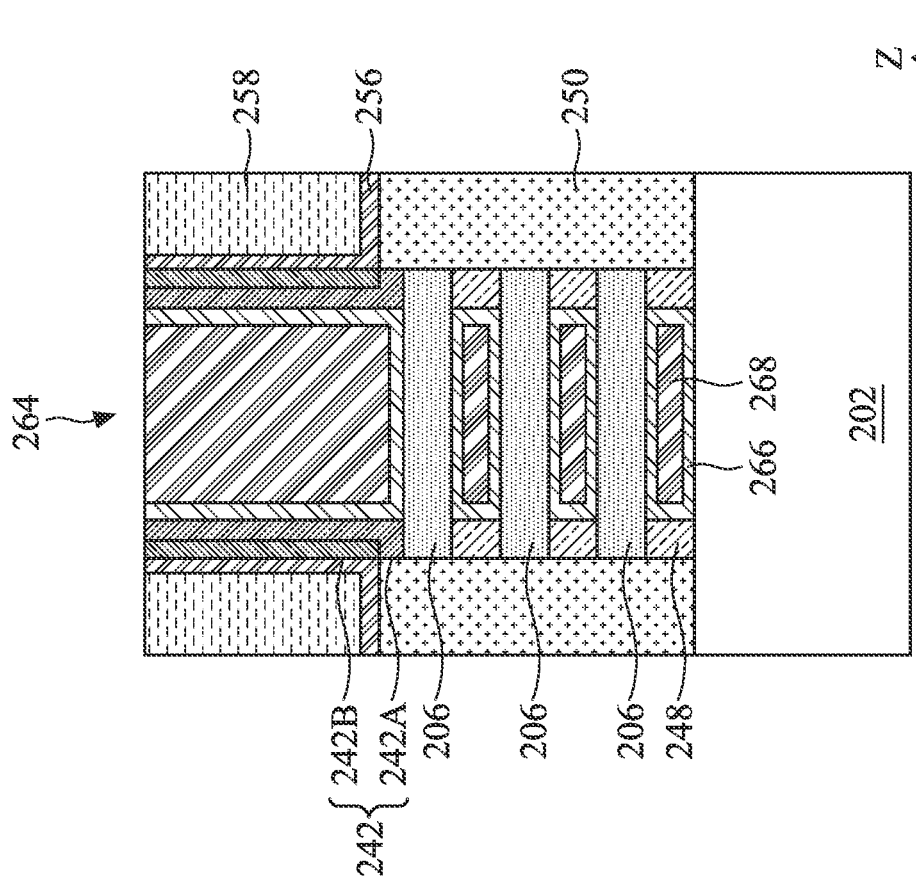

The method 100 then proceeds to operation 140 (FIG. 1B) where a gate structure is formed. The resultant structure is shown in FIGS. 13A-13D. FIG. 13A is a perspective view of the device 200, FIG. 13B refers to a cross-sectional view taken in the gate region and perpendicular to a lengthwise direction of the channel (e.g., along the B-B line), FIG. 13C refers to a cross-sectional view taken in the channel region and along the lengthwise direction of the channel (e.g., along the C-C line), and FIG. 13D refers to a cross-sectional view taken though a gate region previously reserved by the sacrificial capping layer 222 and along the lengthwise direction of the channel (e.g., along the D-D line). The gate structure may be the gate of a multi-gate transistor. The gate structure may be a high-K/metal gate (HK MG) stack, however other compositions are possible. In some embodiments, the gate structure forms the gate associated with the multi-channels provided by the plurality of channel members (e.g., nanosheets or nanowires having gaps therebetween) in the channel region.

In an embodiment of operation 140, a HK MG stack 264 is formed within the gate trench 260 of the device 200 provided by the release of the epitaxial layers 208, described above with reference to prior operation 138. In various embodiments, the HK MG stack 264 includes an interfacial layer (not shown), a high-K gate dielectric layer 266 formed over the interfacial layer, and a gate electrode layer 268 formed over the high-K gate dielectric layer 266. High-K gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stack 264 and the S/D features 250 is the inner spacers 248, providing isolation.

In some embodiments, the interfacial layer of the HK MG stack 264 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer 266 of the HK MG stack 264 may include a high-K dielectric such as hafnium oxide ($HfO_2$). Alternatively, the high-K gate dielectric layer 266 of the HK MG stack 264 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 266 may be formed by ALD, physical vapor deposition (PVD), CVD, oxidation, and/or other suitable methods. As illustrated in FIG. 13D, in some embodiments, the high-K gate dielectric layer 266 is deposited conformally on sidewalls of the inner spacers 248 and top surfaces of the STI features 220.

The gate electrode layer 268 of the HK MG stack 264 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 268 of HK MG stack 264 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 268 of the HK MG stack 264 may be formed by ALD, PVD, CVD, e-beam evaporation, or other suitable process. Further, the gate electrode layer 284 may be formed separately for N-FET and P-FET transistors which may use different metal layers (e.g., for providing an N-type or P-type work function). In various embodiments, a CMP process may be performed to remove excessive metal from the gate electrode layer 268 of the HK MG stack 264, and thereby provide a substantially planar top surface of the HK MG stack 264. The HK MG stack 264 includes portions that interpose each of the epitaxial layers (channel members) 208, which form channels of the multi-gate device 200.

The device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 14A:
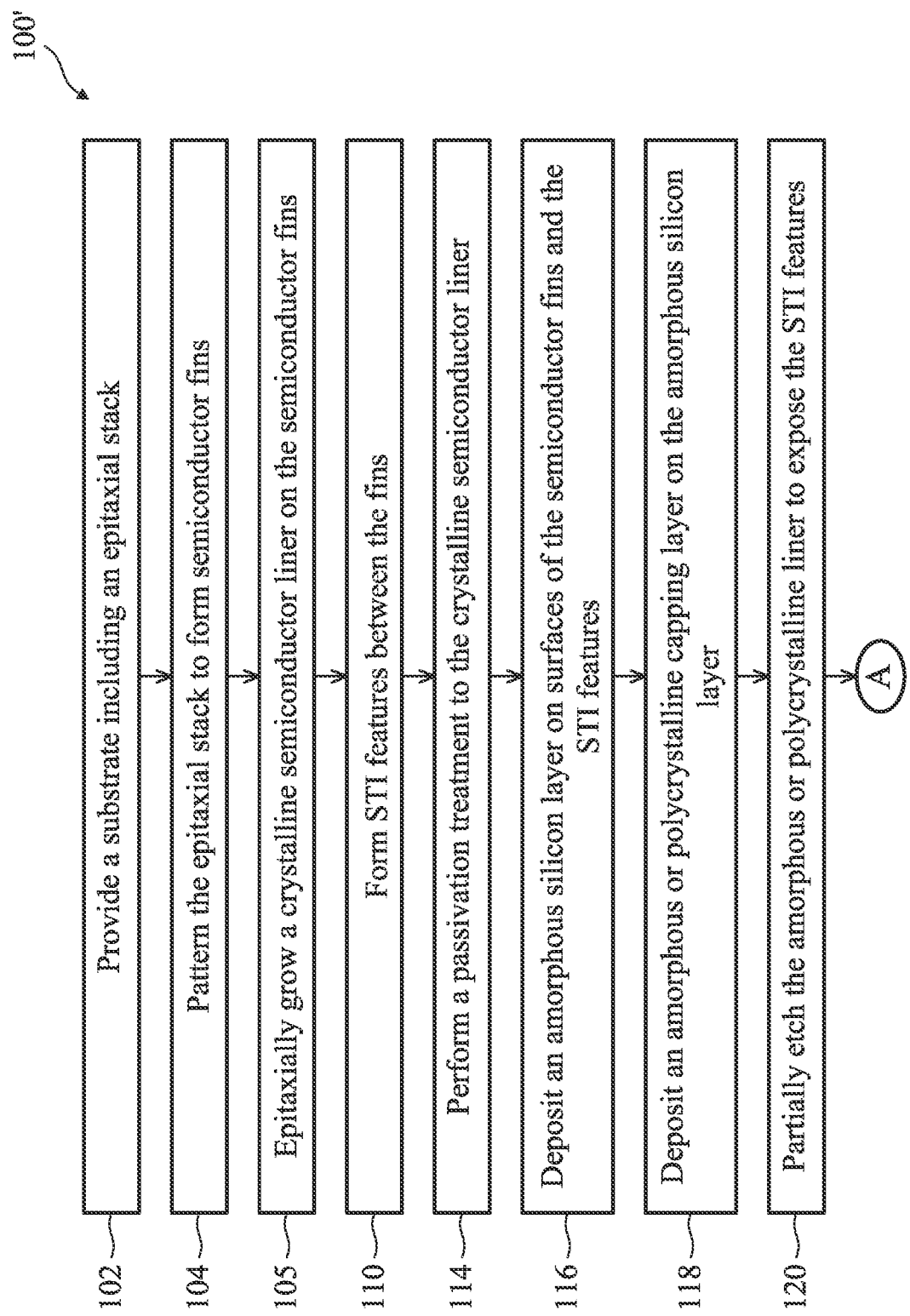
FIGS. 14A and 14B show a flow chart of another method for forming a multi-gate device, according to one or more aspects of the present disclosure.
Figure 14B:
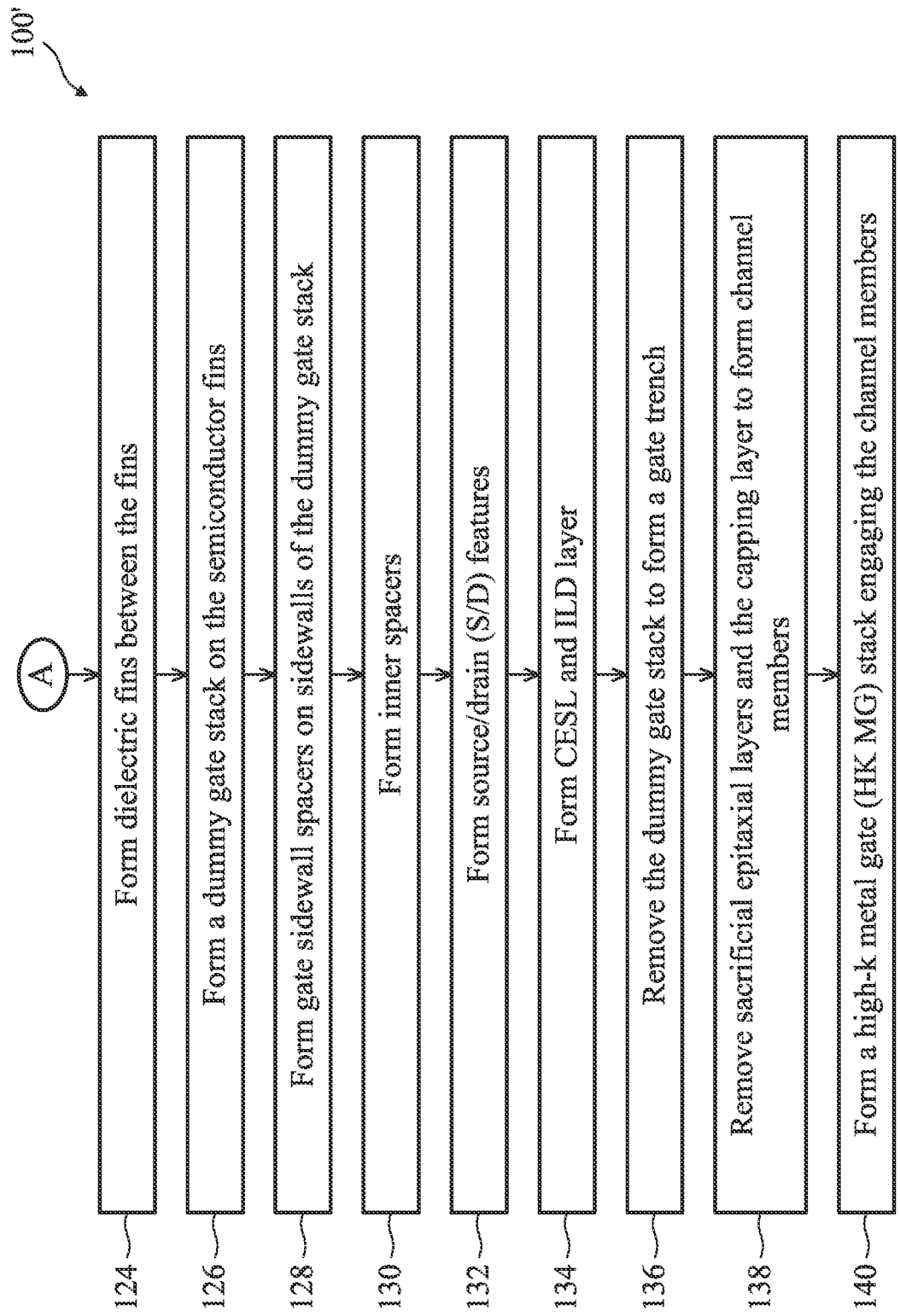

Reference is now made to FIGS. 14A and 14B, which demonstrate a flow chart for a method 100'. The method 100' shares operations 102 and 104 with method 100. After operation 104, the method 100' proceeds to operation 105. After operation 105, the method 100' shares operation 110 with the method 100. After operation 110, the method 100' proceeds to operations 114, 116, 118, and 120. After operation 120, the method 100' shares operations 124, 126, 128, 130, 132, 134, 136, 138, and 140 with the method 100. The method 100' is described below in conjunction with FIGS. 15-20D. Shared operations are not repeated below in the interest of conciseness.

Figure 15:
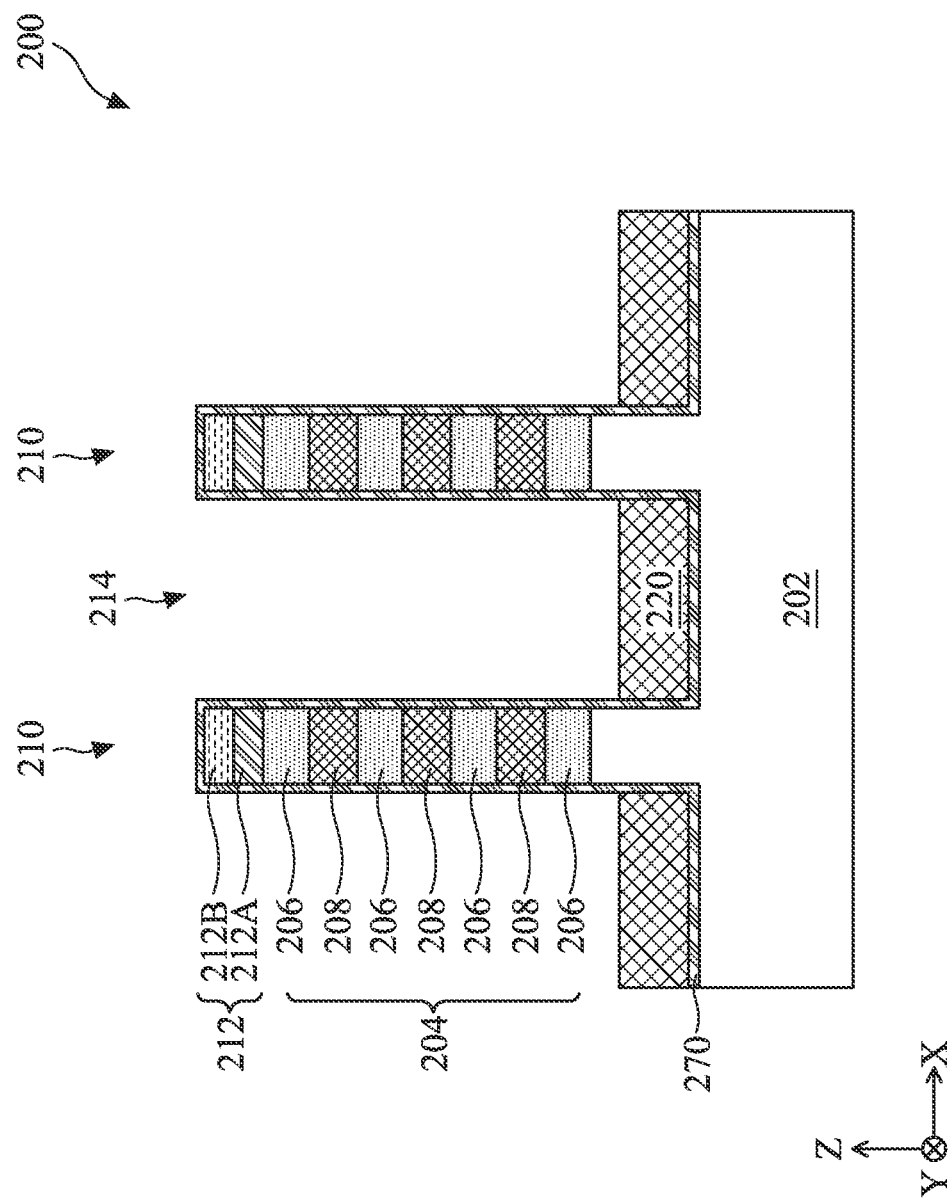
FIGS. 15, 16, 17, 18, 19, 20B, 20C, and 20D illustrate cross-sectional views of a semiconductor structure during a fabrication process according to the method of FIGS. 14A and 14B, according to aspects of the present disclosure.

Referring to FIG. 15, after operations 102 and 104 in forming semiconductor fins 210, the method 100' at operation 105 (FIG. 14A) deposits a semiconductor liner 270 along top and sidewall surfaces of the semiconductor fins 210 and the top surface of the substrate 202. In the illustrated embodiment, the semiconductor liner 270 is a silicon layer formed in an epitaxial growth process, such as an MBE process, an MOCVD process, an ALD process, and/or other suitable epitaxial growth processes. The epitaxial growth results in the silicon layer having a determined thickness. For example, the silicon layer may have a thickness from about 1 nm to about 3 nm. The semiconductor material (e.g., Si) of the semiconductor liner 270 extends the crystalline structure of the epitaxial stack 204 through the epitaxial growing process. Therefore, the semiconductor liner 270 may also be referred to a crystalline semiconductor liner.

Still referring to FIG. 15, the method 100' at operation 110 (FIG. 14A) that is shared with the method 100 forms isolation features, such as shallow trench (STI) features 220, between the semiconductor fins 210. In the illustrated embodiment, a top surface of the STI features 220 is below the bottommost epitaxial layer 206. The crystalline semiconductor liner 270 is stacked between the STI features 220 and the substrate 202.

Figure 16:
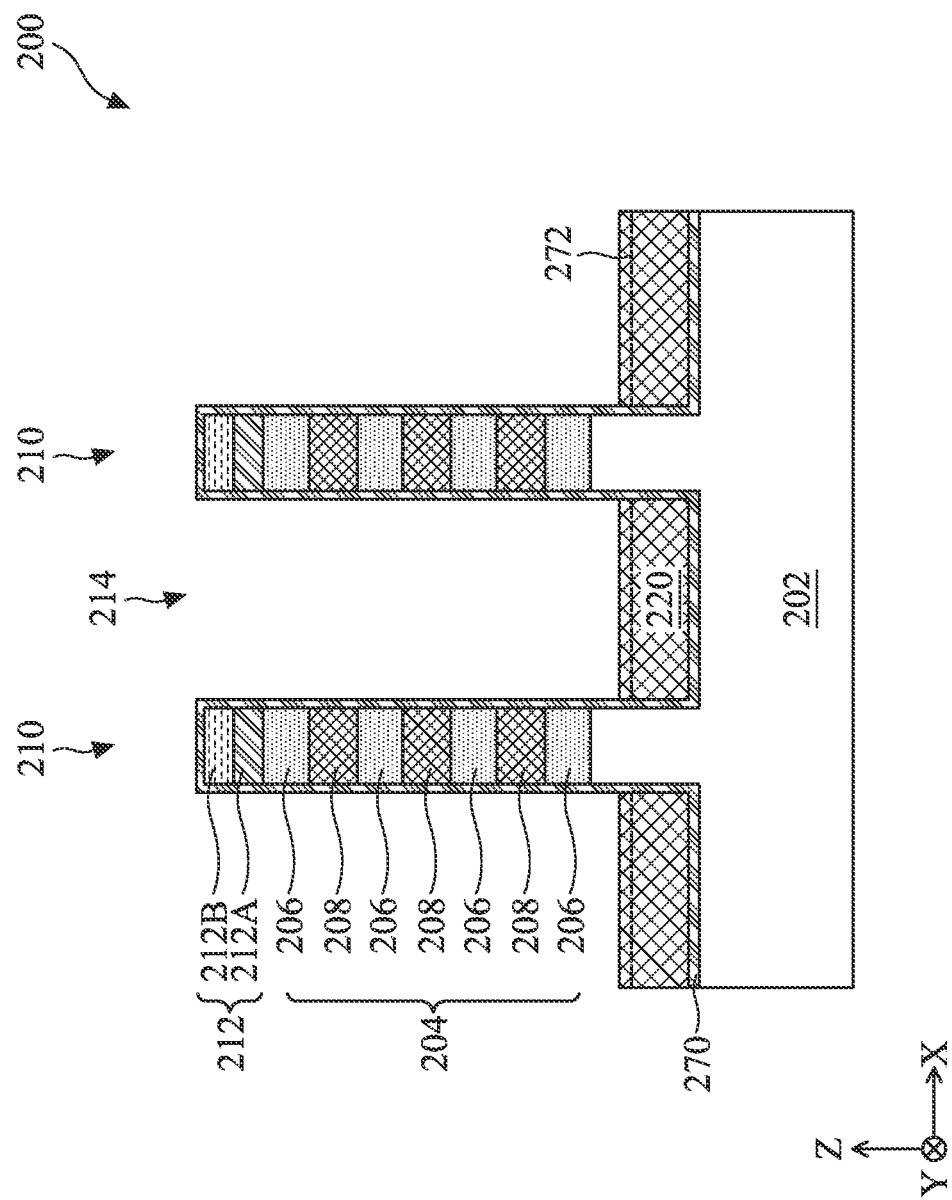

Referring to FIG. 16, the method 100' at operation 114 (FIG. 14A) performs a passivation treatment to the exposed portions of the crystalline semiconductor liner 270. The passivation treatment may include an oxidation process, a nitridation process, or a combination thereof. In some embodiments, the passivation treatment is a nitridation process comprising rapid thermal nitridation (RTN) process, high pressure nitridation (HPN), or decoupled plasma nitridation (DPN) process. In some embodiments, the RTN process is performed at a temperature of about 400° C. to about 800° C., using $NH_3$ as reaction gas, for about 1 second to about 180 seconds. In some embodiments, the HPN process is performed using a process gas of $NH_3$ at a pressure from about 1 atm to about 25 atm and a temperature from about 300° C. to about 700° C. for about 1 minute to about 10 minutes. In some embodiments, the DPN process is performed under a power of about 300 Watts to about 2250 Watts, using a process gas of $N_2$, $NH_3$, $N_2$+Ar, $N_2$+He, $NH_3$+Ar, or the like as process gases. The nitridation process causes the semiconductor material in the crystalline semiconductor liner 270 to react with the N, which converts exposed portions of the crystalline semiconductor liner 270 to a nitride compound. In one example, the crystalline semiconductor liner 270 is a crystalline silicon layer and is converted to silicon nitride after operation 114. The nitridation process may also passivate a surface portion of the STI features 220 (e.g., above a dotted line 272). In one example, the STI features 220 includes silicon oxide and the surface portion above the dotted line 272 is converted to silicon oxynitride after operation 114, while the bottom portion below the dotted line 272 remains as silicon oxide. In some embodiments, the dotted line 272 is about 1 nm to about 3 nm from the top surface of the STI features 220. A vertical portion of the crystalline semiconductor liner 270 stacked between the STI features 220 and the substrate 202 which is above the dotted line 272 may also be converted to a nitride compound, such as silicon nitride in one example.

Figure 17:
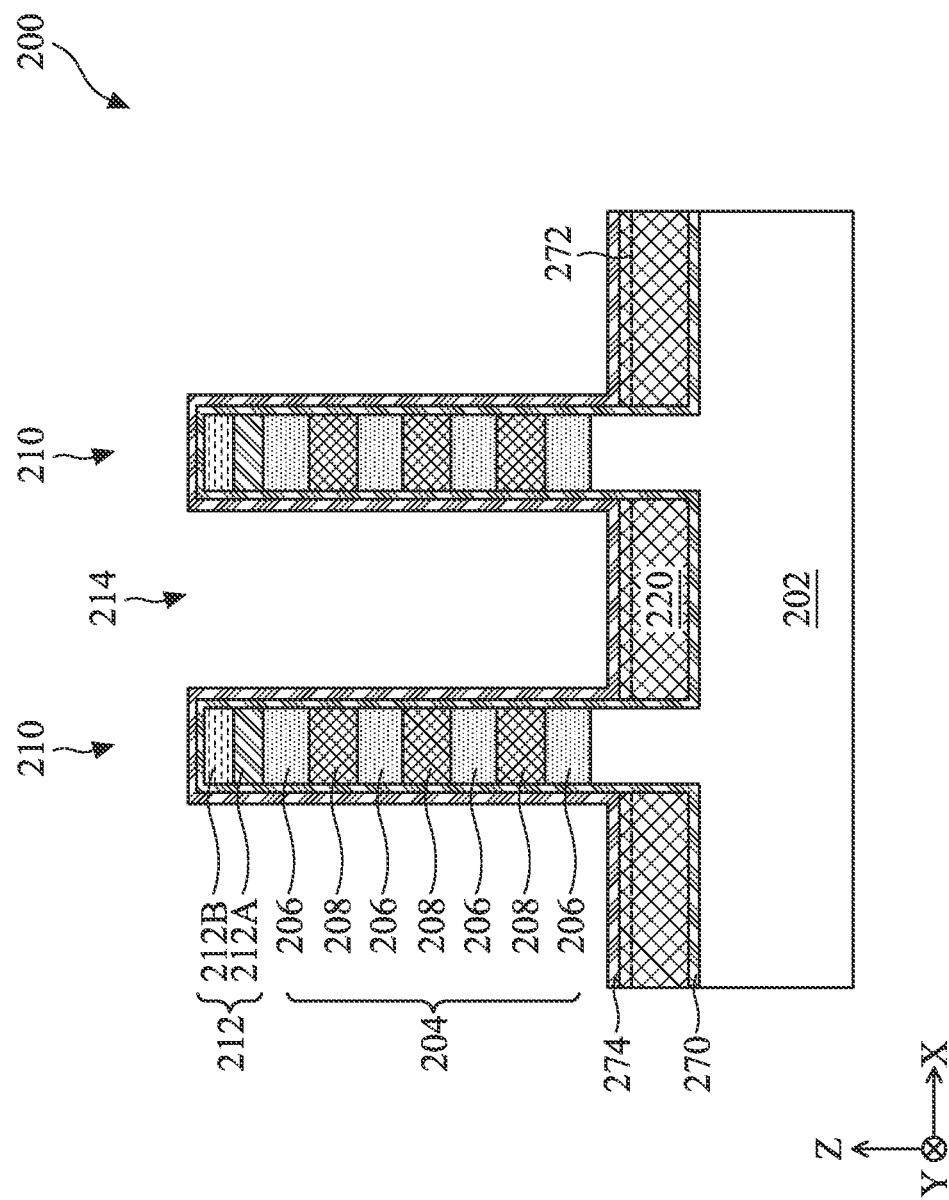

Referring to FIG. 17, the method 100' at operation 116 (FIG. 14A) deposits a semiconductor liner 274 on the exposed portions of the nitrified liner 270 and the top surfaces of the STI features 220. The semiconductor liner 274 may be disposed conformally. By way of example, the semiconductor liner 274 may be formed by depositing a semiconductor material over the device 200 using processes such as, CVD process, a subatmospheric CVD (SACVD) process, a flowable CVD process, an ALD process, a PVD process, or other suitable process. In some embodiments, the semiconductor liner 274 may have a thickness from about 1 nm to about 3 nm. Due to the underneath nitrified liner 270 and the STI features 220, semiconductor composition in the semiconductor liner 274 won't grow in crystalline structures but stays in amorphous form instead. In some embodiments, the semiconductor liner 274 includes amorphous silicon and may also be referred to as an amorphous silicon layer. As will be explained in detail below, the semiconductor liner 274 functions as a seed layer, allowing an amorphous or polycrystalline semiconductor layer as a sacrificial capping layer to be deposited thereon.

Figure 18:
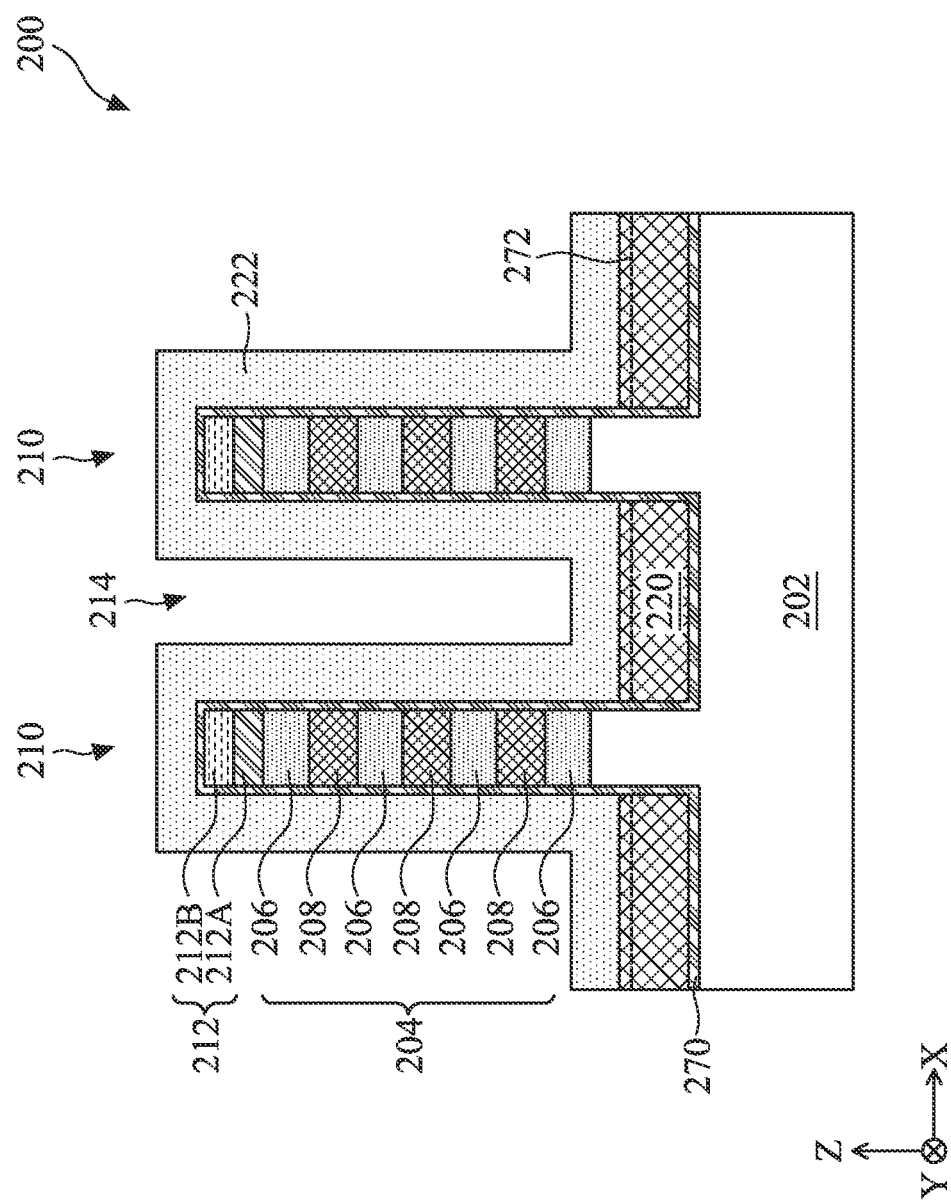

Referring to FIG. 18, the method 100' at operation 118 (FIG. 14A) deposits a capping layer 222 on top and sidewall surfaces of the semiconductor liner 274. In the illustrated embodiment, the capping layer 222 is conformally deposited over the device 200. For example, the capping layer 222 is a semiconductor layer and deposited by an epitaxial growing process, such that the epitaxial growth of the capping layer 222 is on the exposed semiconductor surfaces of the semiconductor liner 274 as a seed layer. In some embodiments, during the epitaxial growing process, the semiconductor liner 274 intermixes with the capping layer 222 and becomes a portion of the capping layer 222. Accordingly, the semiconductor liner 274 is not shown in FIG. 18. Alternatively, the semiconductor liner 218 with a further reduced thickness (not shown in FIG. 18) may remain underneath the capping layer 222. By way of example, the capping layer 222 may be deposited by an MBE process, an MOCVD process, an ALD process, and/or other suitable epitaxial growth processes. In furtherance of the example, the semiconductor liner 274 is an amorphous silicon layer, and the capping layer 222 includes the same semiconductor material as the epitaxial layer 206, such as SiGe. Due to the amorphous form of the seed layer, the semiconductor material in the capping layer 222 won't grow in crystalline structures but in amorphous form or polycrystalline form instead, such as amorphous SiGe or polycrystalline SiGe in some embodiments. The capping layer 222 reserves a space for subsequently-formed metal gate stack and will be removed in a subsequent processing stage. Therefore, the capping layer 222 is also referred to as a sacrificial capping layer.

Figure 19:
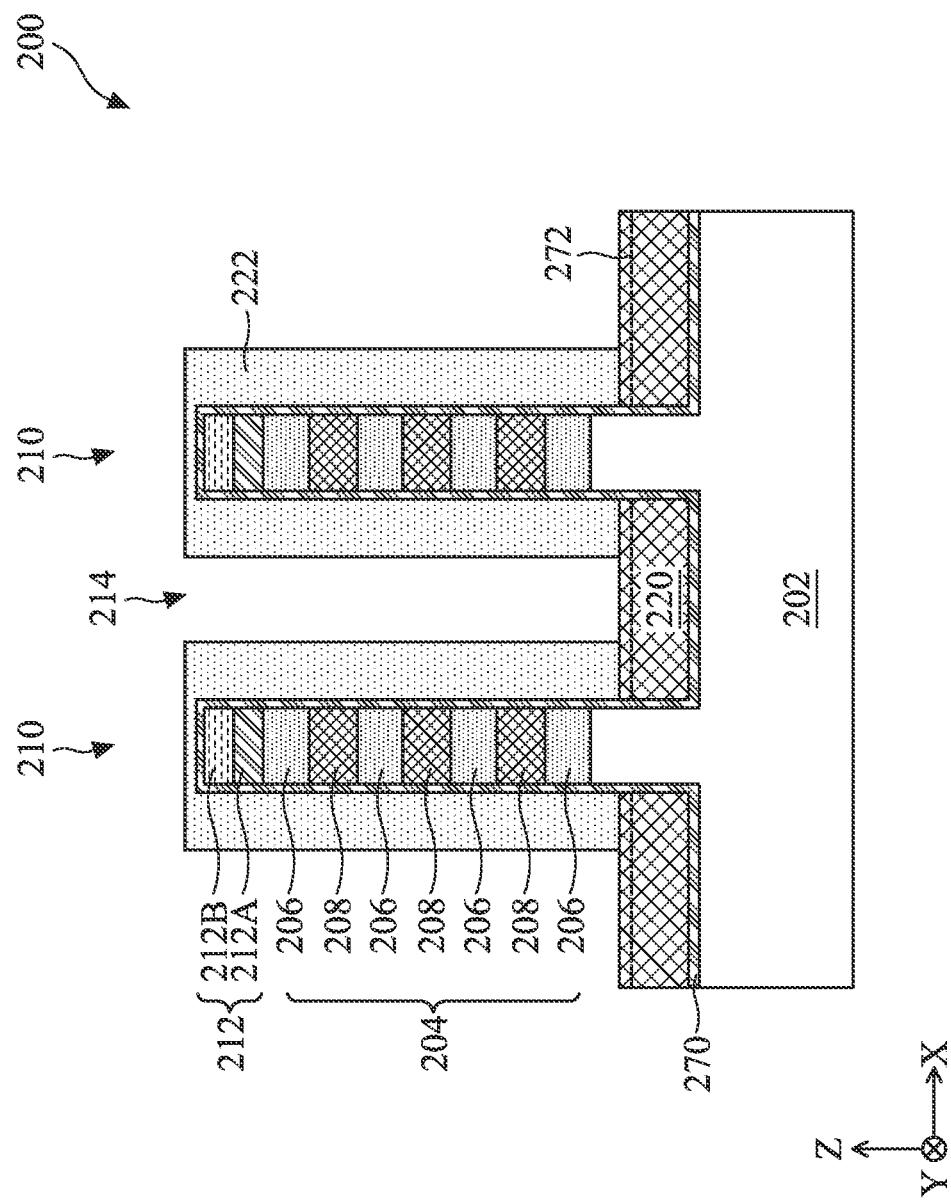

Referring to FIG. 19, the method 100' at operation 120 (FIG. 14A) performs an etch-back process to remove portions of the sacrificial capping layer 222 to expose top surfaces of the STI features 220. In some embodiments, the etch-back process may include a wet etch process, a dry etch process, a multiple-step etch process, and/or a combination thereof. It is noted that after the etch-back process, the capping layer 222 remains disposed on sidewall surfaces of the semiconductor fins 210. In furtherance of some embodiments, a thinned portion of the capping layer 222 also remains on the top surfaces of the semiconductor fins, as illustrated in FIG. 19.

Figure 20B:
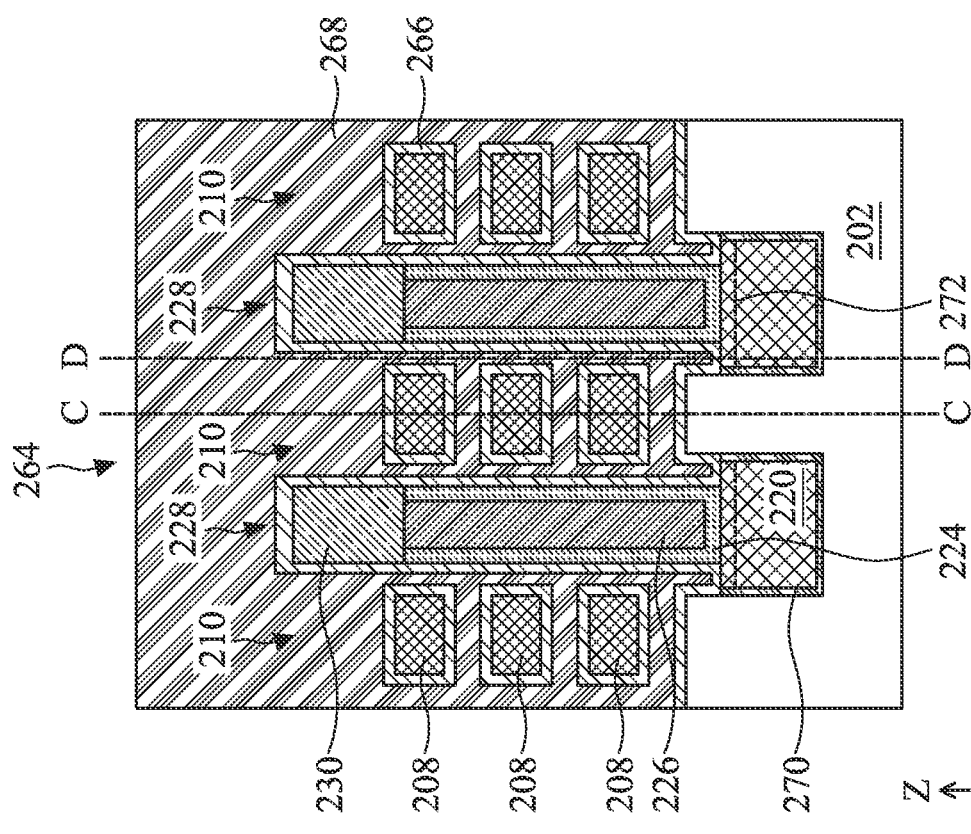
Figure 20A:
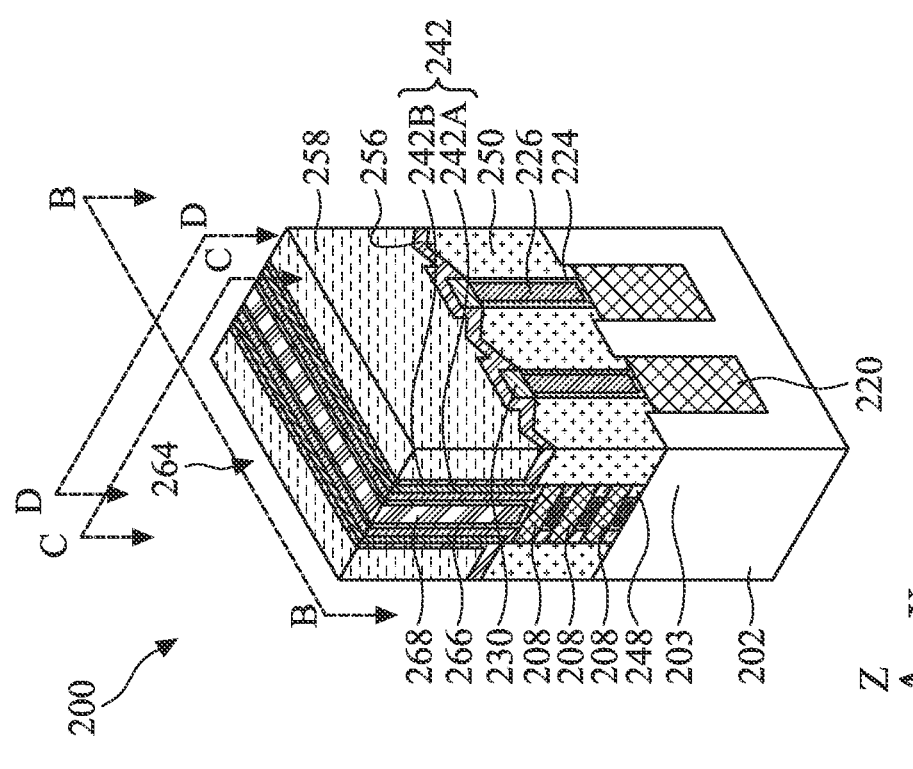
FIG. 20A illustrates a perspective view of a semiconductor structure during a fabrication process according to the method of FIGS. 14A and 14B, according to aspects of the present disclosure.
Figure 20D:
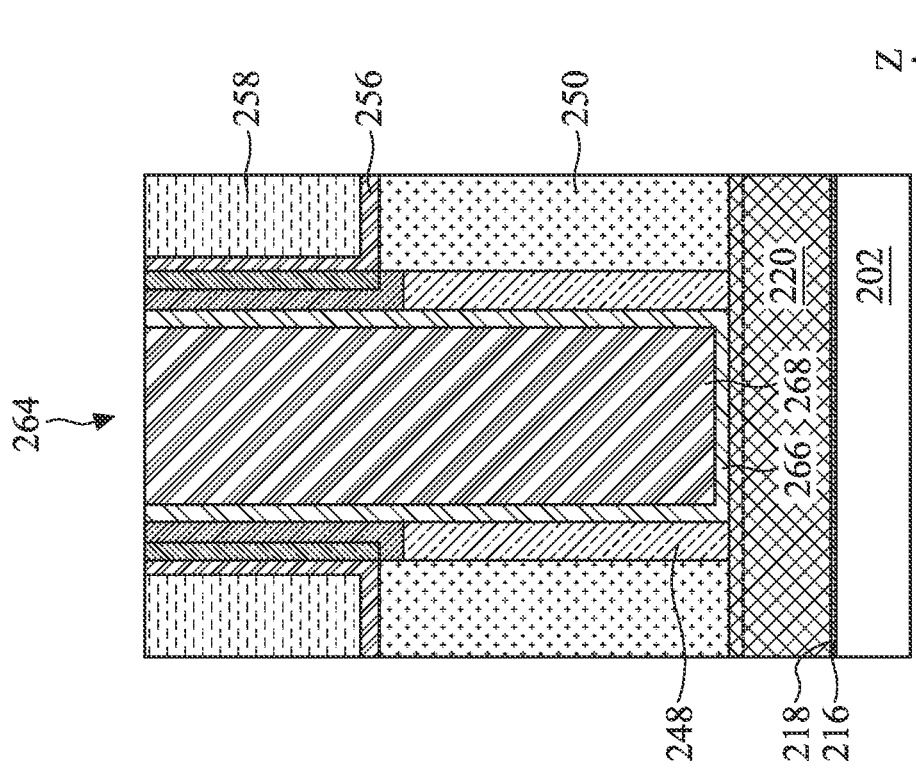
Figure 20C:
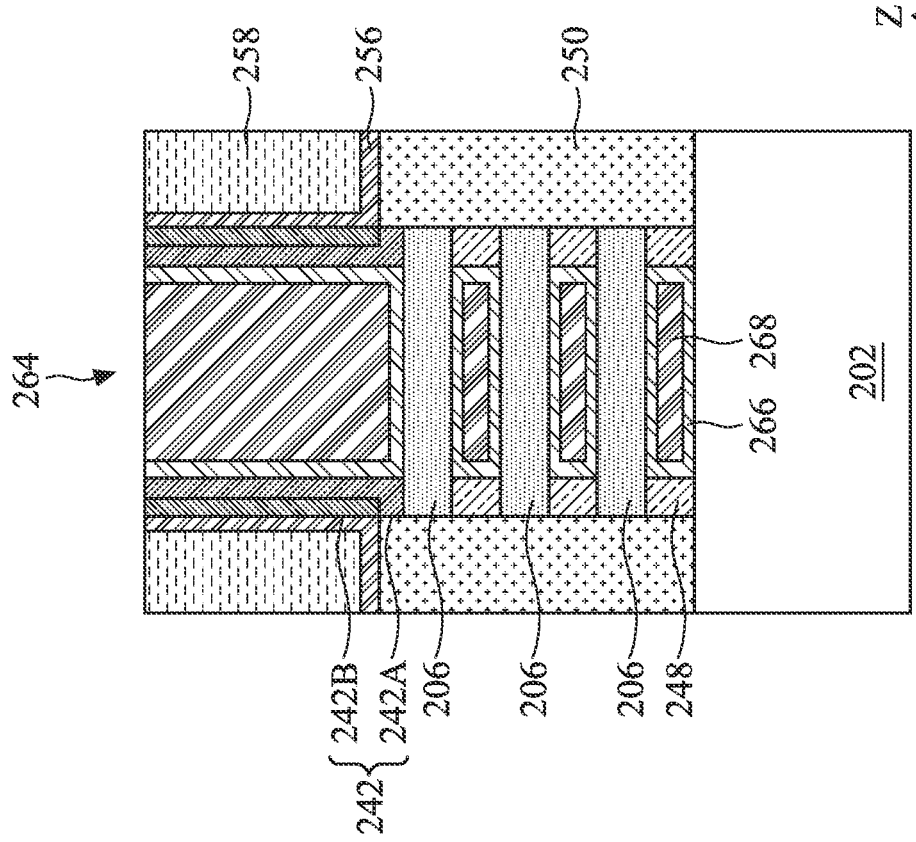

After operation 120, the method 100' shares operations 124, 126, 128, 130, 132, 134, 136, 138, and 140 with the method 100. Shared operations are not repeated below in the interest of conciseness. After operation 140, the resultant structure 200 is shown in FIGS. 20A-20D. FIG. 20A is a perspective view of the device 200, FIG. 20B refers to a cross-sectional view taken in the gate region and perpendicular to a lengthwise direction of the channel (e.g., along the B-B line), FIG. 20C refers to a cross-sectional view taken in the channel region and along the lengthwise direction of the channel (e.g., along the C-C line), and FIG. 20D refers to a cross-sectional view taken though a gate region previously reserved by the sacrificial capping layer 222 and along the lengthwise direction of the channel (e.g., along the D-D line). After operation 140, the device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100', and some process steps described above may be replaced or eliminated in accordance with various embodiments of the method 100'.

Although not intended to be limiting, one or more embodiments of the present disclosure provide many benefits to a semiconductor device and the formation thereof.

For example, embodiments of the present disclosure provide dielectric fins for improving fin uniformity and defining space for source/drain (S/D) features, and sacrificial capping layers with amorphous or polycrystalline semiconductor material for reserving space for metal gate stacks. The amorphous or polycrystalline semiconductor material allows sacrificial capping layers to maintain vertical footing after etching process, which in turn improves inner spacer layer footing profile and metal gate stack footing profile and reduces S/D feature defects in footing regions. Furthermore, the dielectric fin and sacrificial capping layer formation method can be easily integrated into existing semiconductor fabrication processes.

In one exemplary aspect, the present disclosure is directed to a method. The method includes forming a semiconductor fin extruding from a substrate; forming a sacrificial capping layer on sidewalls of the semiconductor fin; forming first and second dielectric fins sandwiching the semiconductor fin; forming a sacrificial gate stack over the semiconductor fin, the sacrificial capping layer, and the first and second dielectric fins; forming gate spacers on sidewalls of the sacrificial gate stack; removing the sacrificial gate stack to form a gate trench, wherein the gate trench exposes the semiconductor fin, the sacrificial capping layer, and the first and second dielectric fins; removing the sacrificial capping layer from the gate trench, thereby exposing the sidewalls of the semiconductor fin; and forming a metal gate stack in the gate trench engaging the semiconductor fin. In some embodiments, the sacrificial capping layer includes amorphous or polycrystalline semiconductor material. In some embodiments, the semiconductor material is silicon germanium. In some embodiments, the forming of the sacrificial capping layer includes depositing an amorphous silicon layer covering the semiconductor fin; forming an isolation feature covering a bottom portion of the amorphous silicon layer; and depositing the sacrificial capping layer over a top portion of the amorphous silicon layer. In some embodiments, the forming of the sacrificial capping layer includes forming an isolation feature on the sidewalls of the semiconductor fin; depositing an amorphous silicon layer covering the semiconductor fin and the isolation feature; and depositing the sacrificial capping layer covering the amorphous silicon layer. In some embodiments, the forming of the sacrificial capping layer further includes etching the sacrificial capping layer, thereby exposing a top surface of the isolation feature. In some embodiments, the method further includes forming an isolation feature on the sidewalls of the semiconductor fin prior to the forming of the sacrificial capping layer, wherein the first and second dielectric fins are in contact with the isolation feature and the sacrificial capping layer. In some embodiments, the method further includes recessing the semiconductor fin and the sacrificial capping layer after the forming of the gate spacers; and epitaxially growing a source/drain (S/D) feature on the recessed semiconductor fin. In some embodiments, the first and second dielectric fins limit the epitaxially growing of the S/D feature in a lateral direction. In some embodiments, the semiconductor fin includes a plurality of sacrificial layers and a plurality of channel layers, wherein the sacrificial layers and the channel layers are alternately arranged. In some embodiments, the method further includes laterally etching the sacrificial layers and the sacrificial capping layer, thereby forming cavities between the channel layers; and depositing an inner spacer layer in the cavities.

In another exemplary aspect, the present disclosure is directed to a method of fabricating a semiconductor device. The method includes forming a stack of a first type and a second type epitaxial layers on a semiconductor substrate, the first type and second type epitaxial layers having different material compositions and the first type and second type epitaxial layers being alternatingly disposed in a vertical direction; patterning the stack to form a plurality of fin elements; depositing a first liner over the fin elements, wherein the first liner incudes an amorphous semiconductor material; depositing a second liner over the first liner, wherein the second liner includes an amorphous or polycrystalline semiconductor material; forming a sacrificial gate stack over the fin elements; forming gate spacers over the sacrificial gate stack; removing the sacrificial gate stack, thereby forming a gate trench; removing the second type epitaxial layers and the second liner from the gate trench, thereby exposing the first type epitaxial layers in the gate trench; and forming a gate stack in the gate trench and wrapping around the first type epitaxial layers. In some embodiments, the second type epitaxial layers and the second liner include a same semiconductor composition in different material structure forms. In some embodiments, the second type epitaxial layers and the second liner both include silicon germanium. In some embodiments, the method further includes depositing a dielectric layer between the fin elements, wherein the dielectric layer is in contact with the second liner, and wherein the gate stack is in contact with the dielectric layer after the forming of the gate stack. In some embodiments, the method further includes prior to the depositing of the first liner, depositing a third liner over the fin elements; and performing a nitridation treatment to the third liner.

In yet another exemplary aspect, the present disclosure is directed to a multi-gate semiconductor device. The multi-gate semiconductor device includes channel members disposed over a substrate; an isolation feature over the substrate; an amorphous semiconductor layer stacked between the isolation feature and the substrate; first and second dielectric fins disposed over the isolation feature and sandwiching the channel members; and a gate structure engaging the channel members and over the first and second dielectric fins. In some embodiments, the multi-gate semiconductor device further includes an oxide layer stacked between the amorphous semiconductor layer and the substrate. In some embodiments, the multi-gate semiconductor device further includes a source/drain (S/D) feature adjacent the channel members, wherein the S/D feature is in contact with the isolation feature and the first and second dielectric fins. In some embodiments, each of the first and second dielectric fins has a bottom portion including a low-K material and a top portion including a high-K material.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin extruding from a substrate;
   forming a sacrificial capping layer on sidewalls of the semiconductor fin;

forming first and second dielectric fins sandwiching the semiconductor fin;

forming a sacrificial gate stack over the semiconductor fin, the sacrificial capping layer, and the first and second dielectric fins;

forming gate spacers on sidewalls of the sacrificial gate stack;

removing the sacrificial gate stack to form a gate trench, wherein the gate trench exposes the semiconductor fin, the sacrificial capping layer, and the first and second dielectric fins;

removing the sacrificial capping layer from the gate trench, thereby exposing the sidewalls of the semiconductor fin; and forming a metal gate stack in the gate trench engaging the semiconductor fin.

2. The method of claim 1, wherein the sacrificial capping layer includes amorphous or polycrystalline semiconductor material.

3. The method of claim 2, wherein the semiconductor material is silicon germanium.

4. The method of claim 1, wherein the forming of the sacrificial capping layer includes:
   depositing an amorphous silicon layer covering the semiconductor fin;
   forming an isolation feature covering a bottom portion of the amorphous silicon layer; and
   depositing the sacrificial capping layer over a top portion of the amorphous silicon layer.

5. The method of claim 1, wherein the forming of the sacrificial capping layer includes:
   forming an isolation feature on the sidewalls of the semiconductor fin;
   depositing an amorphous silicon layer covering the semiconductor fin and the isolation feature; and
   depositing the sacrificial capping layer covering the amorphous silicon layer.

6. The method of claim 5, wherein the forming of the sacrificial capping layer further includes:
   etching the sacrificial capping layer, thereby exposing a top surface of the isolation feature.

7. The method of claim 1, further comprising:
   forming an isolation feature on the sidewalls of the semiconductor fin prior to the forming of the sacrificial capping layer, wherein the first and second dielectric fins are in contact with the isolation feature and the sacrificial capping layer.

8. The method of claim 1, further comprising:
   recessing the semiconductor fin and the sacrificial capping layer after the forming of the gate spacers; and
   epitaxially growing a source/drain (S/D) feature on the recessed semiconductor fin.

9. The method of claim 8, wherein the first and second dielectric fins limit the epitaxially growing of the S/D feature in a lateral direction.

10. The method of claim 1, wherein the semiconductor fin includes a plurality of sacrificial layers and a plurality of channel layers, wherein the sacrificial layers and the channel layers are alternately arranged.

11. The method of claim 10, further comprising:
    laterally etching the sacrificial layers and the sacrificial capping layer, thereby forming cavities between the channel layers; and
    depositing an inner spacer layer in the cavities.

12. A method of fabricating a semiconductor device, comprising:
    forming a stack of a first type and a second type epitaxial layers on a semiconductor substrate, the first type and second type epitaxial layers having different material compositions and the first type and second type epitaxial layers being alternatingly disposed in a vertical direction;
    patterning the stack to form a plurality of fin elements;
    depositing a first liner over the fin elements, wherein the first liner incudes an amorphous semiconductor material;
    depositing a second liner over the first liner, wherein the second liner includes an amorphous or polycrystalline semiconductor material;
    forming a sacrificial gate stack over the fin elements;
    forming gate spacers over the sacrificial gate stack;
    removing the sacrificial gate stack, thereby forming a gate trench;
    removing the second type epitaxial layers and the second liner from the gate trench, thereby exposing the first type epitaxial layers in the gate trench; and
    forming a gate stack in the gate trench and wrapping around the first type epitaxial layers.

13. The method of claim 12, wherein the second type epitaxial layers and the second liner include a same semiconductor composition in different material structure forms.

14. The method of claim 13, wherein the second type epitaxial layers and the second liner both include silicon germanium.

15. The method of claim 12, further comprising:
    depositing a dielectric layer between the fin elements, wherein the dielectric layer is in contact with the second liner, and wherein the gate stack is in contact with the dielectric layer after the forming of the gate stack.

16. The method of claim 12, further comprising:
    prior to the depositing of the first liner, depositing a third liner over the fin elements; and
    performing a nitridation treatment to the third liner.

17. A multi-gate semiconductor device, comprising:
    channel members disposed over a substrate;
    an isolation feature over the substrate;
    an amorphous semiconductor layer stacked between the isolation feature and the substrate;
    first and second dielectric fins disposed over the isolation feature and sandwiching the channel members; and
    a gate structure engaging the channel members and over the first and second dielectric fins.

18. The multi-gate semiconductor device of claim 17, further comprising:
    an oxide layer stacked between the amorphous semiconductor layer and the substrate.

19. The multi-gate semiconductor device of claim 17, further comprising:
    a source/drain (S/D) feature adjacent the channel members, wherein the S/D feature is in contact with the isolation feature and the first and second dielectric fins.

20. The multi-gate semiconductor device of claim 17, wherein each of the first and second dielectric fins has a bottom portion including a low-K material and a top portion including a high-K material.

* * * * *